(12) United States Patent
Johansen

(10) Patent No.: US 10,356,943 B2
(45) Date of Patent: Jul. 16, 2019

(54) INDUSTRIAL FAN ASSEMBLY

(71) Applicant: DEKALB BLOWER INC., Yorkville, IL (US)

(72) Inventor: Eric J. Johansen, Newark, IL (US)

(73) Assignee: DEKALB BLOWER INC., Yorkville, IL (US)

( * ) Notice: Subject to any disclaimer, the term of this patent is extended or adjusted under 35 U.S.C. 154(b) by 201 days.

(21) Appl. No.: 15/626,985

(22) Filed: Jun. 19, 2017

(65) Prior Publication Data

US 2018/0368280 A1 Dec. 20, 2018

(51) Int. Cl.
| | |
|---|---|
| F28F 9/00 | (2006.01) |
| H05K 7/20 | (2006.01) |
| F04D 29/60 | (2006.01) |
| F01D 25/24 | (2006.01) |
| F04D 17/16 | (2006.01) |
| F04D 25/02 | (2006.01) |
| F04D 25/06 | (2006.01) |
| F04D 29/62 | (2006.01) |
| F01D 25/00 | (2006.01) |

(52) U.S. Cl.
CPC ......... *H05K 7/20172* (2013.01); *F01D 25/24* (2013.01); *F04D 17/16* (2013.01); *F04D 25/02* (2013.01); *F04D 25/06* (2013.01); *F04D 29/601* (2013.01); *F04D 29/626* (2013.01); *F01D 25/00* (2013.01); *H05K 7/20* (2013.01)

(58) Field of Classification Search
CPC .......... F01D 25/00; F01D 24/00; H05K 7/20; H05K 7/20172; F04D 29/626

USPC .................................................. 416/178, 187
See application file for complete search history.

(56) References Cited

U.S. PATENT DOCUMENTS

| | | |
|---|---|---|
| 4,040,769 A | 8/1977 | Britz |
| 4,253,483 A | 3/1981 | Cornelius |
| 4,373,509 A | 2/1983 | Neitzel et al. |
| 4,508,486 A | 4/1985 | Tinker |
| 4,775,294 A | 10/1988 | LaPorte |
| 5,006,064 A | 4/1991 | Freund |
| 5,171,128 A | 12/1992 | Williamson et al. |
| 5,238,453 A | 8/1993 | Heil |
| 5,567,380 A | 10/1996 | Hoover |
| 5,673,681 A | 10/1997 | Neitzel et al. |

(Continued)

OTHER PUBLICATIONS

Garden City Fan & Blower Co., "PF2 Propeller. Plug Units," Bulletin PF681C 1982, p. 13.

*Primary Examiner* — Marguerite J McMahon
(74) *Attorney, Agent, or Firm* — Miller, Matthias & Hull LLP

(57) ABSTRACT

A fan mount assembly is disclosed for an industrial fan assembly that has a motor with a motor shaft, a fan shaft, a transmission operatively connecting the motor shaft to the fan shaft to drive the fan shaft, and an impeller mounted on the fan shaft. A top plate has top plate slots proximate top plate lateral edges, and first and second side plates have side plate tabs extending upward from side plate top edges. The first side plate tabs and the second side plate tabs are each inserted through the corresponding top plate slots until the side plate top edges engage the top plate. The top plate slots and the side plate tabs may be dimensioned for a relatively close fit so that the side plates are at approximately their proper alignment relative to the top plate when the side plate top edges engage the top plate.

20 Claims, 11 Drawing Sheets

(56) References Cited

U.S. PATENT DOCUMENTS

| | | |
|---|---|---|
| D393,708 S | 4/1998 | Haeck |
| 5,809,993 A | 9/1998 | Neitzel et al. |
| D405,170 S | 2/1999 | Haeck |
| 5,879,815 A | 3/1999 | Schotz |
| 5,894,737 A | 4/1999 | Haeck |
| 5,915,960 A | 6/1999 | Check et al. |
| 6,050,258 A | 4/2000 | Neitzel et al. |
| 6,156,090 A * | 12/2000 | Ishikawa ................. F04D 29/30 55/471 |
| 6,251,153 B1 | 6/2001 | Neitzel et al. |
| 6,457,550 B1 | 10/2002 | Barry et al. |
| 6,505,502 B1 | 1/2003 | Brownell et al. |
| 6,644,337 B2 | 11/2003 | Heil |
| 6,797,041 B2 | 9/2004 | Brownell et al. |
| 6,994,743 B2 | 2/2006 | Brownell et al. |
| 7,018,289 B2 | 3/2006 | Heil et al. |
| 7,049,499 B1 | 5/2006 | Mathson et al. |
| 7,320,636 B2 | 1/2008 | Seliger et al. |
| 7,547,249 B2 | 6/2009 | Seliger et al. |
| 7,682,231 B2 | 3/2010 | Enzenroth et al. |
| 7,758,305 B2 | 7/2010 | Kurszewski et al. |
| 8,025,477 B2 | 9/2011 | Ganesh et al. |
| 8,221,082 B2 | 7/2012 | Key |
| 8,758,101 B2 | 6/2014 | Khalitov et al. |
| 8,932,013 B2 | 1/2015 | Khalitov et al. |
| 9,004,868 B2 | 4/2015 | Rhodes |
| 9,182,131 B1 | 11/2015 | Prasser et al. |
| 9,505,092 B2 | 11/2016 | Brownell et al. |
| 2002/0086574 A1* | 7/2002 | Vinson ................. H01R 13/745 439/247 |
| 2004/0254037 A1 | 12/2004 | Williamson et al. |
| 2005/0111972 A1* | 5/2005 | Penlesky ............. F04D 29/4226 415/206 |
| 2005/0143001 A1* | 6/2005 | Merlet ................. H05K 5/0213 454/184 |
| 2005/0159101 A1 | 7/2005 | Hrdina et al. |
| 2005/0204582 A1 | 9/2005 | Rossi et al. |
| 2007/0202795 A1 | 8/2007 | Seliger et al. |
| 2011/0067836 A1* | 3/2011 | Tang ................. F04D 25/166 165/67 |
| 2011/0155345 A1* | 6/2011 | Li ............................ G06F 1/183 165/67 |
| 2011/0317362 A1* | 12/2011 | Chen ........................ G06F 1/20 361/695 |
| 2012/0156019 A1* | 6/2012 | Gong ........................ G06F 1/20 415/182.1 |
| 2012/0322358 A1 | 12/2012 | Wendorski et al. |
| 2014/0241868 A1 | 8/2014 | Brownell et al. |
| 2014/0241894 A1 | 8/2014 | Brownell et al. |
| 2015/0086349 A1 | 3/2015 | Ganesh et al. |
| 2015/0176603 A1 | 6/2015 | Fetting et al. |
| 2015/0267713 A1 | 9/2015 | Robinson et al. |
| 2015/0345512 A1 | 12/2015 | Robinson et al. |
| 2016/0081222 A1 | 3/2016 | Robinson et al. |
| 2016/0138606 A1 | 5/2016 | Barry |
| 2016/0356278 A1 | 12/2016 | Khalitov et al. |
| 2016/0356287 A1 | 12/2016 | Khalitov et al. |

* cited by examiner

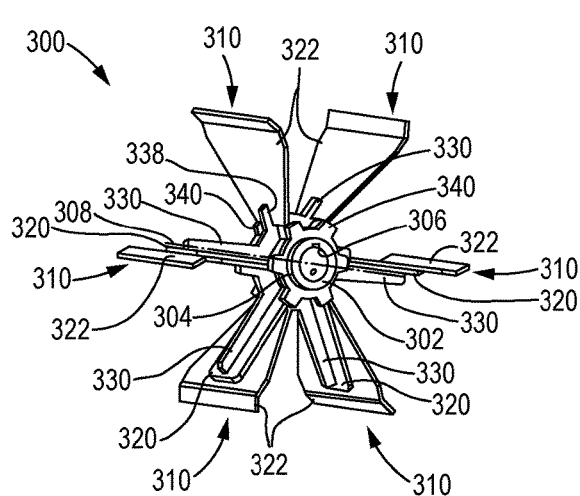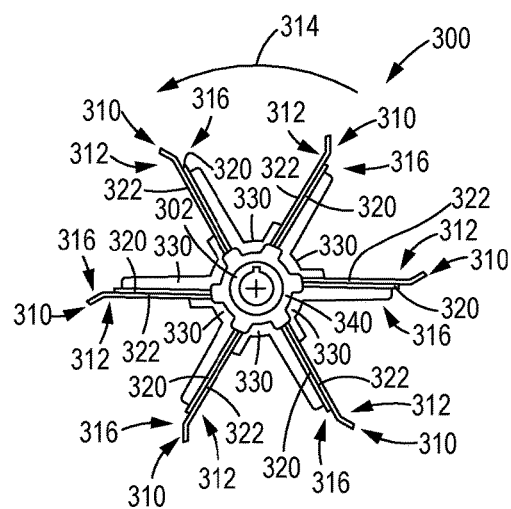
FIG. 12    FIG. 13
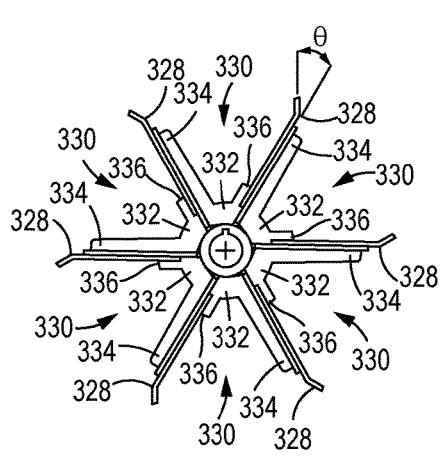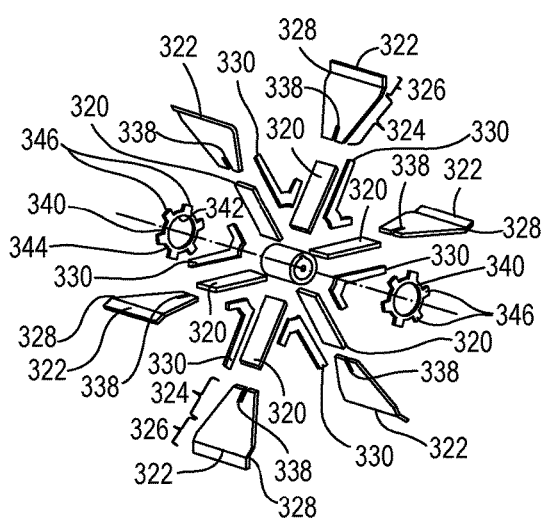
FIG. 14    FIG. 15

INDUSTRIAL FAN ASSEMBLY

TECHNICAL FIELD

The present disclosure relates generally to industrial fan assemblies and, more particularly, to a modular fan mount assembly for an industrial fan assembly.

BACKGROUND

Industrial fan assemblies are used in industrial applications to create fluid flow for processes such as combustion, ventilation, aeration, particulate transport, exhaust, cooling, air-cleaning, drying and air recirculation. Fluid flow is created by rotating an impeller having a plurality of blades to create a reduced pressure at an inlet of the fan assembly to draw air in and an increased pressure at an outlet of the fan assembly to discharge air back into the operating environment. Typically, an industrial fan assembly includes a mounting structure on which a motor and a fan shaft are mounted. A transmission connects the motor to the shaft to convert rotation of a motor shaft of the motor into corresponding rotation of the fan shaft. The impeller is mounted on or otherwise operatively connected to the fan shaft so that rotation of the fan shaft causes rotation of the impeller to generate the fluid flow.

Industrial fans may be generally categorized as being either centrifugal fans or axial fans depending on the flow path of the air passing there through. Centrifugal fans use the rotating impeller to draw air in, typically entering the impeller along an axial path parallel to a rotational axis of the impeller. The air is then redirected to radial flow paths through the impeller blades and out of the fan assembly. The airflow gains kinetic energy as the air moves radially outward toward the impeller blade tips, and the kinetic energy is converted to a static pressure increase beyond the impeller blades causing discharge the air through the fan outlet. Axial fans in contrast move fluid along the rotational axis of the impeller. The fluid is pressurized by the axial forces, or aerodynamic lift, generated by the impeller blades.

The impeller blades of the industrial fan assemblies are subjected to loads and stresses during the operation of the fan assemblies. Where the industrial fan assemblies are implemented in high temperature environments, the impeller blades are further subjected to thermal stresses that, along with the other loads and stresses, can cause the impeller blades to change shape from having a formed radius and blade twist for optimum performance, and thereby result in reduced efficiency and unwanted vibration. These changes can also result in increased sound levels, increased turbulence past the impeller that increases the resistance of the system and the static pressure against which the fan operates. The components of the industrial fan assemblies may also be affected by chemicals and by-products in corrosive atmospheres. Ultimately, the additional thermal stresses and other adverse conditions can result in earlier fatigue failure of the impeller and more frequent need for replacement in high temperature environments as the fan endures numerous thermal cycles from process and in corrosive environments due to exposure to harmful chemicals than when operating in environments that do not cause the same level of thermal stresses or corrosive exposure on the impellers.

SUMMARY OF THE DISCLOSURE

In one aspect of the present disclosure, a fan mount assembly for an industrial fan assembly is disclosed. The industrial fan assembly may have a motor with a motor shaft, a fan shaft, a transmission operatively connecting the motor shaft to the fan shaft to drive the fan shaft, and an impeller mounted on the fan shaft. The fan mount assembly includes a top plate having a top plate top surface, a top plate bottom surface, a first top plate lateral edge, a second top plate lateral edge opposite the first top plate lateral edge, a first top plate slot proximate the first top plate lateral edge and a second top plate slot proximate the second top plate lateral edge. The fan mount assembly further includes a first side plate having a first side plate inner surface, a first side plate outer surface, a first side plate top edge and a first side plate tab extending upward from the first side plate top edge, and a second side plate having a second side plate inner surface, a second side plate outer surface, a second side plate top edge and a second side plate tab extending upward from the second side plate top edge. The first side plate tab is inserted through the first top plate slot until the first side plate top edge engages the top plate bottom surface, and the second side plate tab is inserted through the second top plate slot until the second side plate top edge engages the top plate bottom surface.

In another aspect of the present disclosure, a fan assembly is disclosed. The fan assembly includes a motor with a motor shaft, a fan shaft, a transmission operatively connecting the motor shaft to the fan shaft to drive the fan shaft, an impeller mounted on the fan shaft, and a fan mount assembly top plate having a top plate top surface, a top plate bottom surface, a first top plate lateral edge, a second top plate lateral edge opposite the first top plate lateral edge, a first top plate slot proximate the first top plate lateral edge and a second top plate slot proximate the second top plate lateral edge. The fan assembly further includes a first shaft bearing mounted to the top plate bottom surface, a second shaft bearing mounted to the top plate bottom surface, wherein the fan shaft extends through the first shaft bearing and the second shaft bearing, a fan mount assembly first side plate having a first side plate inner surface, a first side plate outer surface, a first side plate top edge and a first side plate tab extending upward from the first side plate top edge, and a fan mount assembly second side plate having a second side plate inner surface, a second side plate outer surface, a second side plate top edge and a second side plate tab extending upward from the second side plate top edge. The first side plate tab is inserted through the first top plate slot until the first side plate top edge engages the top plate bottom surface, and the second side plate tab is inserted through the second top plate slot until the second side plate top edge engages the top plate bottom surface.

In a further aspect of the present disclosure, a fan mount assembly for an industrial fan assembly is disclosed. The industrial fan assembly has a motor with a motor shaft, a fan shaft, a transmission operatively connecting the motor shaft to the fan shaft to drive the fan shaft, and an impeller mounted on the fan shaft. The fan mount assembly includes a top plate having a top plate top surface, a top plate bottom surface, a first top plate lateral edge, a second top plate lateral edge opposite the first top plate lateral edge, a first top plate slot and a second top plate slot proximate the first top plate lateral edge, and a third top plate slot and a fourth top plate slot proximate the second top plate lateral edge. The fan mount assembly further includes a first side plate having a first side plate inner surface, a first side plate outer surface, a first side plate top edge, a first side plate tab extending upward from the first side plate top edge and having a first motor height adjustment aperture, and a second side plate tab extending upward from the first side plate top edge and having a second motor height adjustment aperture, and a second side plate having a second side plate inner surface, a second side plate outer surface, a second side plate top edge, a third side plate tab extending upward from the second side plate top edge and having a third motor height adjustment aperture, and a fourth side plate tab extending upward from the second side plate top edge and having a fourth motor height adjustment aperture. The first side plate tab and the second side plate tab are inserted through the first top plate slot and the second top plate slot, respectively, until the first side plate top edge engages the top plate bottom surface, and the third side plate tab and the fourth side plate tab are inserted through the third top plate slot and the fourth top plate slot, respectively, until the second side plate top edge engages the top plate bottom surface. The fan mount assembly also includes a motor mounting bracket having a motor mounting plate having a motor plate top surface to which the motor is secured, a motor plate bottom surface, a first motor plate lateral edge and a second motor plate lateral edge opposite the first motor plate lateral edge a first motor height adjustment plate extending downward from the first motor plate lateral edge and having a first motor height adjustment slot and a second motor height adjustment slot, and a second motor height adjustment plate extending downward from the second motor plate lateral edge and having a third motor height adjustment slot and a fourth motor height adjustment slot. A first motor height adjustment fastener is inserted through the first motor height adjustment aperture and the first motor height adjustment slot, a second motor height adjustment fastener is inserted through the second motor height adjustment aperture and the second motor height adjustment slot, a third motor height adjustment fastener is inserted through the third motor height adjustment aperture and the third motor height adjustment slot, and a fourth motor height adjustment fastener inserted through the fourth motor height adjustment aperture and the fourth motor height adjustment slot. A height of the motor mounting plate and the motor above the top plate is set by positioning the motor mounting bracket relative to the top plate and securing the first motor height adjustment plate to the first side plate tab and the second side plate tab with the first motor height adjustment fastener and the second motor height adjustment fastener, and securing the second motor height adjustment plate to the third side plate tab and the fourth side plate tab with the third motor height adjustment fastener and the fourth motor height adjustment fastener.

Additional aspects are defined by the claims of this patent.

BRIEF DESCRIPTION OF THE DRAWINGS

FIG. 12 is an isometric view of a further alternative embodiment of an impeller of the industrial fan assembly of FIG. 1 in accordance with the present disclosure;

FIG. 13 is an end view of the impeller of FIG. 12;

FIG. 14 is an end view of the impeller of FIG. 12 with a hub sprocket removed;

FIG. 15 is an isometric exploded view of the impeller of FIG. 12;

DETAILED DESCRIPTION

Figure 1:
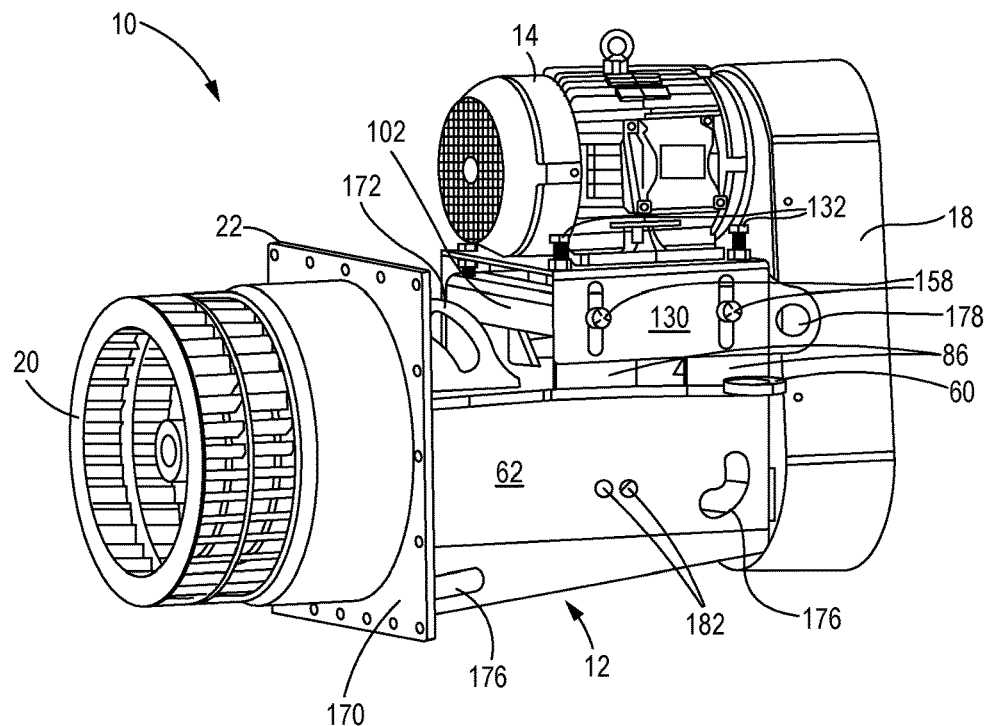
FIG. 1 is an isometric view of an industrial fan assembly including an embodiment of a fan mount assembly in accordance with the present disclosure.

FIG. 1 illustrates an exemplary configuration of an industrial fan assembly 10 that may be implemented in high temperature applications. The industrial fan assembly 10 may include a fan mount assembly 12 supporting a motor 14, a fan shaft 16 (FIG. 3), and a transmission 18 connecting the motor 14 to the fan shaft 16. The fan assembly 10 further includes an impeller 20, such as the forward curve wheel hub impeller 20 shown in FIG. 1, mounted to an end of the fan shaft 16 opposite the transmission 18. The impeller 20 may be installed within a high temperature area such as a furnace or curing station, while the other components of the industrial fan assembly 10 are disposed external to the high temperature environment. An insulation dam assembly 22 may be positioned on the fan shaft 16 between the fan mount assembly 12 and the impeller 20, and mounted to a wall or other interface between the high temperature and low temperature areas to reduce or prevent heat transfer across the interface. The insulation dam assembly 22 can also prevent infiltration of the ambient atmosphere into the environment of the impeller 20 from negative pressure created by the spinning of the impeller 20, and vice versa where the impeller 20 is disposed within a pressurized environment.

Figure 2:
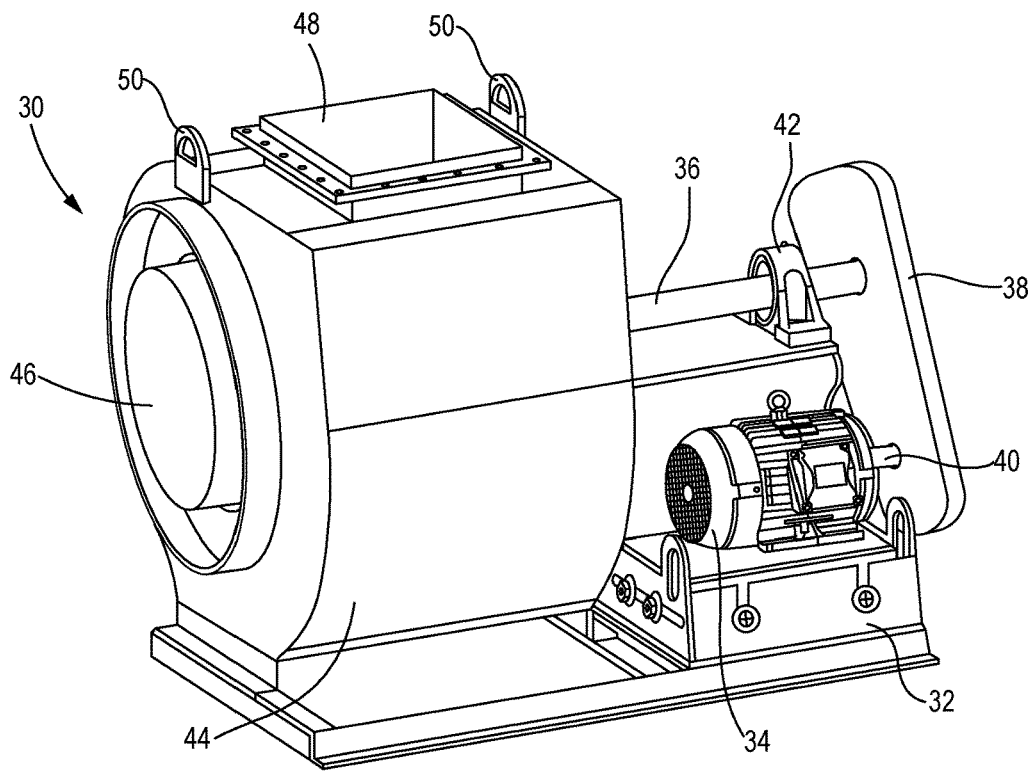
FIG. 2 is an isometric view of an industrial fan assembly including an alternative embodiment of a fan mount assembly in accordance with the present disclosure.

FIG. 2 illustrates an alternative free-standing configuration of an industrial fan assembly 30 typically used in exhausting applications and having a fan mount assembly 32, a motor 34, a fan shaft 36 and a transmission 38 configured to specific applications. FIG. 2 more clearly illustrates the motor shaft 40 of the motor 34 and the fan shaft 36 connected by the transmission 38, and the fan shaft 36 being rotatably mounted on the fan mount assembly 32 by shaft bearings 42. An impeller (not shown) such as the impeller 20 or other appropriate impeller such as those illustrated and described further hereinafter, may be mounted to the fan shaft 36 opposite the transmission 38 and disposed within a fan housing 44. The fan housing 44 may be insulated and function similar to the insulation dam assembly 22 with regard to limiting heat transfer between the high temperature and low temperature areas to ensure workforce safety and protect personnel from burn hazards even in implementations where the high temperature environment can have temperatures in excess of 1,800° F. The fan housing 44 includes a fan housing inlet 46 for drawing air to the impeller, and a fan housing outlet 48 for expelling air from the fan housing 44. The fan housing 44 may include additional fan housing outlets 48 circumferentially spaced about the fan housing 44 to offer alternate discharge directions depending on the requirements of a particular customer installation. In this arrangement, the centrifugal flow impeller and the fan housing 44 change the direction of airflow by 90° from the fan housing inlet 46 to the fan housing outlet 48. When axial flow impellers are used, such as those described below, the fan housing 44 or other airflow control structures may be used to cause inlet air and outlet air to flow in the axial direction through the axial flow impeller relative to the fan shaft 16, 36 and the rotation of the impeller. The fan housing 44 may further include lift brackets 50 to which cables, chains, pulleys, cranes or other positioning mechanisms may be attached to transport and position the fan housing 44 during installation.

Figure 3:
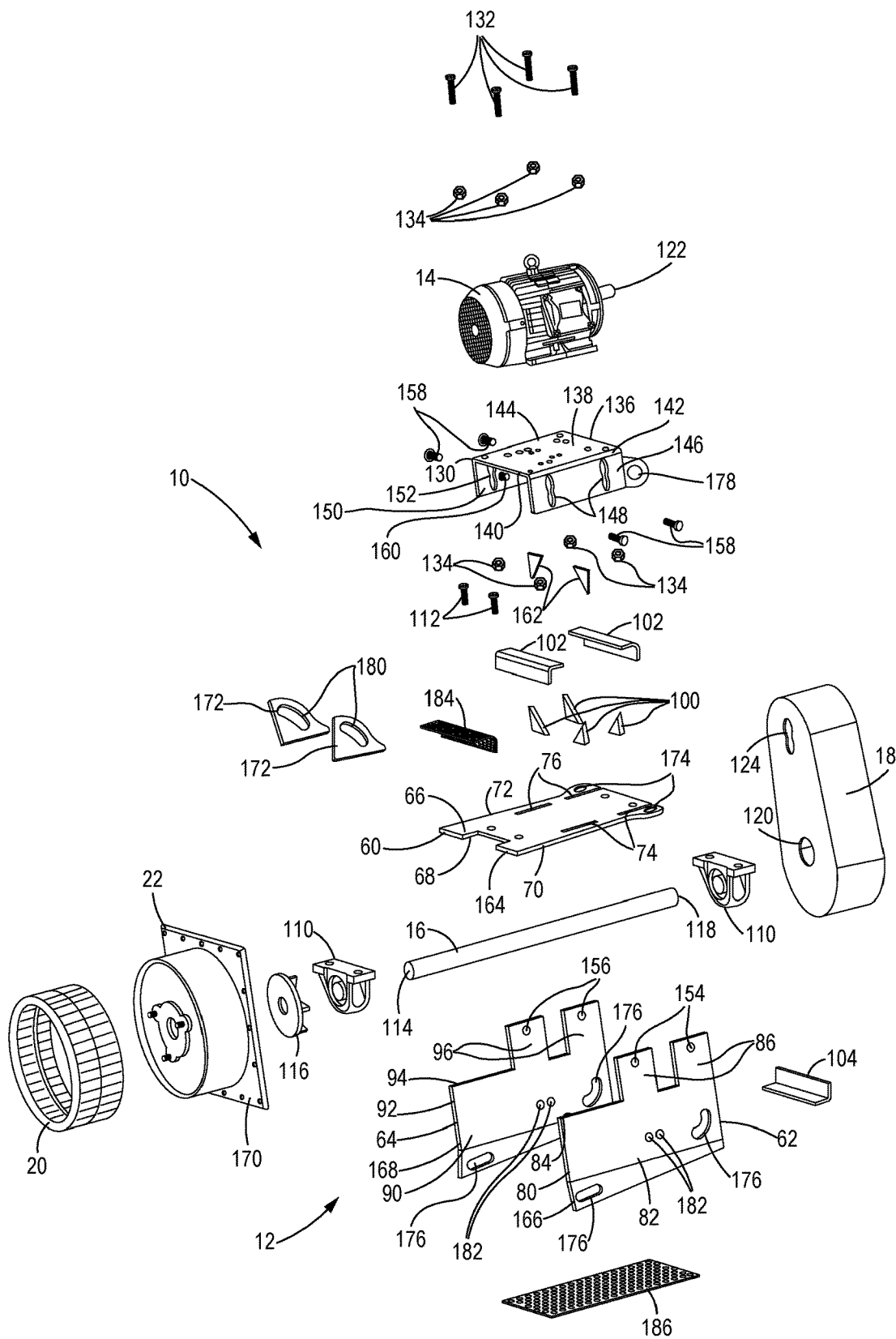
FIG. 3 is an exploded isometric view of the industrial fan assembly of FIG. 1.

Additional details of the fan assembly 10 of FIG. 1 are shown in the exploded view of FIG. 3. The fan mount assembly 12 is shown with the components detached and separated, including components welded together in the final assembly of the fan mount assembly 12. The fan mount assembly 12 includes a top plate 60, a first side plate 62 and a second side plate 64 as main structural components. The top plate 60 has a top plate top surface 66, a top plate bottom surface 68, and a first top plate lateral edge 70 and a second top plate lateral edge 72 disposed on opposite sides of the top plate 60. One or more top plate slots 74 extend through the top plate 60 proximate the first top plate lateral edge 70, and one or more top plate slots 76 extend through the top plate 60 proximate the second top plate lateral edge 72.

The first side plate 62 and the second side plate 64 may be generally planar, but may include some contouring to accommodate other structural elements and components attached to the fan mount assembly 12. The first side plate 62 has a first side plate inner surface 80, a first side plate outer surface 82 and a first side plate top edge 84. The first side plate 62 further includes one or more first side plate tabs 86 extending upward from the first side plate top edge 84. Each of the first side plate tabs 86 corresponds in size and position with one of the top plate slots 74. The second side plate 64 may be a mirror image of the first side plate 62, and includes a second side plate inner surface 90, a second side plate outer surface 92, a second side plate top edge 94 and one or more second side plate tabs 96 extending upward from the second side plate top edge 94 and each corresponding in size and position with one of the top plate slots 76. The main portion of the fan mount assembly 12 may be assembled by inserting the side plate tabs 86, 96 upward through the corresponding top plate slots 74, 76, respectively, until the side plate top edges 84, 94 engage the top plate bottom surface 68. The top plate slots 74, 76 and the side plate tabs 86, 96 may be dimensioned for a relatively close fit so that the side plates 62, 64 are at approximately their proper alignment relative to the top plate 60 when the side plate top edges 84, 94 engage the top plate bottom surface 68.

Further precise alignment of the side plates 62, 64 relative to the top plate 60 may be achieved with additional support structures. For example, tab gussets 100 may be welded to the top plate top surface 66 and corresponding portions of the side plate inner surfaces 80, 90 for each of the side plate tabs 86, 96, respectively, after the side plate tabs 86, 96 are inserted through the top plate slots 74, 76. Upper structural support brackets 102 may be connected between the side plate inner surfaces 80, 90 of the side plate tabs 86, 96 positioned across from each other after the side plate tabs 86, 96 are inserted through the top plate slots 74, 76. One or more lower structural support brackets 104 may be connected between the side plate inner surfaces 80, 90 below the top plate bottom surface 68 before or after the side plate tabs 86, 96 are inserted through the top plate slot 74, 76. The structural support brackets 102, 104 may have lengths that are approximately equal to a distance between the top plate slots 74, 76 so that the side plates 62, 64 are approximately parallel when the fan mount assembly 12 is assembled.

In the illustrated embodiment, the fan shaft 16 is mounted to the top plate bottom surface 68 by a pair of shaft bearings 110 that may be secured by shaft bearing mounting bolts 112 or other appropriate fastening means. The fan shaft 16 extends beyond the top plate 60 and the side plates 62, 64 at both ends. A first shaft end 114 of the fan shaft 16 extends through a heat slinger 116 that is mounted on the fan shaft 16 to act as a heat sink and dissipate heat from the high temperature area. The first shaft end 114 further extends through the insulation dam assembly 22 and has the impeller 20 mounted thereon so that the insulation dam assembly 22 is disposed between the fan mount assembly 12 and the impeller 20.

A second shaft end 118 of the fan shaft 16 is received into the transmission 18 through a transmission fan shaft opening 120. A motor shaft 122 of the motor 14 is received into the transmission 18 by a transmission motor shaft opening 124. The second shaft end 118 and the motor shaft 122 are operatively connected to the internal components of the transmission 18 so that rotation of the motor shaft 122 causes a corresponding rotation of the fan shaft 16 and the impeller 20. The transmission 18 may include belts, chains or other torque transfer components that must be loaded to create sufficient attention to prevent slippage in the transmission 18. Consequently, the transmission motor shaft opening 124 may be an elongated slot that allows the distance between the second shaft end 118 and the motor shaft 122 to be varied as necessary to create the required tension in the components of the transmission 18.

Adjustment of the position of the motor shaft 122 is accomplished in the fan mount assembly 12 by providing a movable motor mounting bracket 130 to which the motor 14 is mounted with motor mounting bolts 132 and motor mounting nuts 134 or other appropriate fastening means. The motor mounting bracket 130 as illustrated includes a motor mounting plate 136 with a motor plate top surface 138 to which the motor 14 is secured, a motor plate bottom surface 140, a first motor plate lateral edge 142 and a second motor plate lateral edge 144 opposite the first motor plate lateral edge 142. A first motor height adjustment plate 146 extends downward from the first motor plate lateral edge 142 and has vertical motor height adjustment slots 148 there through, and a second motor height adjustment plate 150 extends downward from the second motor plate lateral edge 144 and also has vertical motor height adjustment slots 152 extending there through. The first side plate tabs 86 include motor height adjustment apertures 154 that can be aligned with the motor height adjustment slots 148 and the second side plate tabs 96 include motor height adjustment apertures 156 that can be aligned with the motor height adjustment slots 152. When the motor height adjustment apertures 154, 156 are aligned with the motor height adjustment slots 148, 152, respectively, motor height adjustment bolts 158 may be inserted through the pairs of motor height adjustment apertures 154, 156 and motor height adjustment slots 148, 152 and secured therein by the motor height adjustment nuts 160. The height of the motor 14 and the motor mounting plate 136 above the top plate 60, and correspondingly the distance between the second shaft end 118 and the motor shaft 122, is set by positioning the motor mounting bracket 130 relative to the top plate 60 and securing the first motor height adjustment plate 146 to the first side plate tabs 86 and the second motor height adjustment plate 150 to the second side plate tabs 96 with the motor height adjustment bolts 158 and the motor height adjustment nuts 160. If additional structural support as necessary, motor mounting plate gussets 162 may be installed on the motor plate bottom surface 140 and the motor height adjustment plates 146, 150 at locations that will not cause interference with the movement of the motor height adjustment plates 146, 150 relative to the side plate tabs 86, 96.

The fan mount assembly 12 may be secured to the insulation dam assembly 22 to form a single unitary component. In one embodiment, a top plate end edge 164, a first side plate end edge 166 and a second side plate end edge 168 may be secured to an outer surface of an insulation dam mounting plate 170, such as by welding. Further structural support may be provided by wing gussets 172 secured between the top plate top surface 66 and the insulation dam mounting plate 170. One of the wing gussets 172 may be proximate the first top plate lateral edge 70 and be aligned approximately above the first side plate top edge 84, and the other wing gusset 172 may be proximate the second top plate lateral edge 72 and be aligned approximately above the second side plate top edge 94. In alternative embodiments, the wing gussets 172 may be additional side plate tabs 86, 96 extending upward from the side plate top edges 84, 94, respectively. The top plate 60 may have additional top plate slots 74, 76 at the top plate end edge 164 that align with the wing gussets 172/side plate tabs 86, 96. The wing gussets 172 may be inserted through the top plate slots 74, 76 along with the other side plate tabs 86, 96 and then secured to the insulation dam mounting plate 170 by welding or other securement means.

The fan mount assembly 12 may facilitate installation by providing multiple points of attachment for lifting or transportation equipment. Consequently, the top plate 60 may have top plate lift openings 174 proximate the transmission 18, and the side plates 62, 64 may have side plate lift openings 176 proximate both the transmission 18 and the insulation dam assembly 22. The motor mounting bracket 130 may have motor mounting bracket lift openings 178 on each of the motor height adjustment plates 146, 150, and the wing gussets 172 may have a wing gusset lift openings 180. Each of the lift openings 174-180 may be sized for attachment of a rope, chain, hook or other lift or transportation mechanism connection. The fan mount assembly 12 may further facilitate access to the interior of the fan mount assembly 12 via access apertures 182 through the side plates 62, 64. The access apertures 182 can provide convenient access points for bearing lubrication stations for providing lubricant to the shaft bearings 110 without disassembling any components of the fan mount assembly 12 or removing shaft safety guards 184, 186 that may be installed to cover the fan shaft 16. The access apertures 182 may also provide a point of access for providing gas to or purging gas from a rotary seal (see FIGS. 22-25 and accompanying discussion below) that substantially prevents airflow between the high temperature or corrosive environment and the ambient environment.

Figure 4:
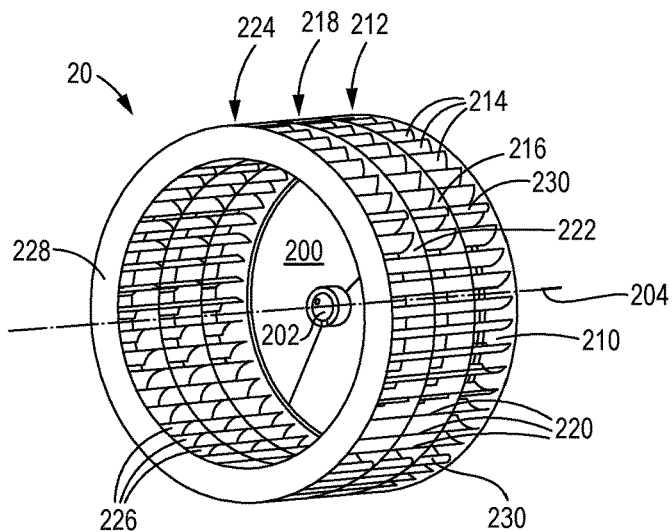
FIG. 4 is an isometric view of an embodiment of an impeller of the industrial fan assembly of FIG. 1 in accordance with the present disclosure.

FIGS. 4-7 illustrate an embodiment of the impeller 20 of the industrial fan assembly 10. The impeller 20 is a forward curved wheel impeller that is configured for extended use in high temperature environments. The impeller 20 may include one or more levels or decks of impeller blades mounted on an impeller hub assembly. In the illustrated embodiment, the impeller has three impeller blade decks. Referring to FIG. 4, the impeller 20 includes an impeller hub assembly 200 having a hub shaft bore 202 for receiving the first shaft end 114 of the fan shaft 16. The hub shaft bore 202 has a bore longitudinal axis 204 about which the impeller hub assembly 200 and the other components of the impeller 20 are symmetrical to facilitate rotation substantially free of vibration.

The impeller 20 further includes an impeller baseplate 210 mounted on the impeller hub assembly 200. The impeller baseplate 210 has an annular shape, a baseplate bottom surface facing and secured to the impeller hub assembly 200, and a baseplate top surface opposite the baseplate bottom surface. A first or bottom impeller blade deck 212 is formed by a plurality of first impeller blades 214 that are secured to and extend upward from the baseplate top surface. The first impeller blades 214 are circumferentially spaced about the bore longitudinal axis 204 and the impeller baseplate 210. A first impeller ring 216 is secured to the first impeller blades 214 opposite the impeller baseplate 210. Similar to the impeller baseplate 210, the first impeller ring 216 has an annular shape, a first ring bottom surface facing and engaging the first impeller blades 214, and a first ring top surface opposite the first ring bottom surface. A second impeller blade deck 218 is formed by a plurality of second impeller blades 220 extending between the first ring top surface and a second ring bottom surface of a second impeller ring 222, and a third impeller blade deck 224 is formed by a plurality of third impeller blades 226 extending between the second ring top surface and a third ring bottom surface of a third impeller ring 228. Three impeller blade decks 212, 218, 224 are shown in the illustrated embodiment, but the impeller 20 in accordance with the present disclosure may have more or fewer impeller blade decks depending on the requirements for the high temperature application.

Figure 5:
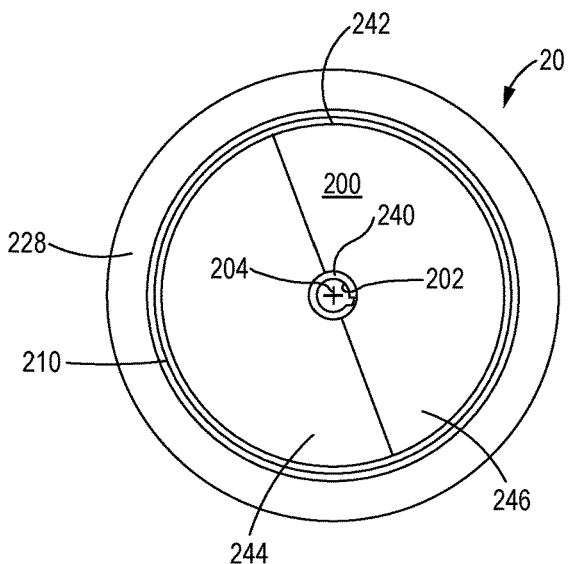
FIG. 5 is a top view of the impeller of FIG. 4.
Figure 6:
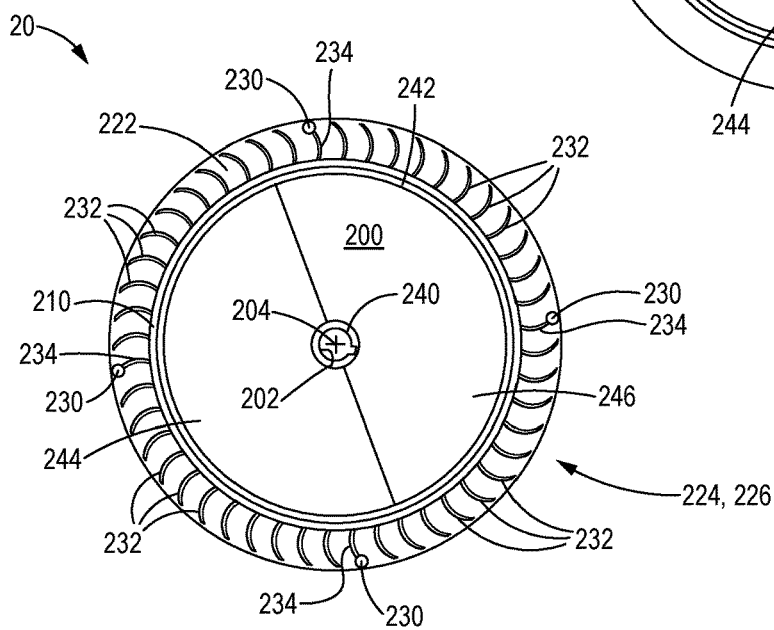
FIG. 6 is a top view of the impeller of FIG. 4 with a top impeller ring removed to reveal a top impeller blade deck.

As shown in the top views of FIG. 5 and FIG. 6 (third impeller ring 228 removed), the impeller baseplate 210 and the impeller rings 216, 222, 228 may have approximately equal outer diameters. The impeller rings 216, 222, 228 may have approximately equal inner diameters, while the impeller baseplate 210 may have a smaller inner diameter to provide greater surface area on the baseplate bottom surface for engagement with the impeller hub assembly 200. In alternative embodiments, the outer diameters and the inner diameters of the impeller baseplate 210 and the impeller rings 216, 222, 228 may not be equal depending on the requirements of a particular implementation.

FIGS. 4 and 6 illustrate the distribution and alignment of the impeller blades 214, 220, 226 within and between the impeller blade decks 212, 218, 224. As mentioned previously, the impeller blades 214, 220, 226 of each impeller blade deck 212, 218, 224 are circumferentially spaced about the bore longitudinal axis 204 is best seen in FIG. 6 for the third impeller blade deck 224. Moreover, each impeller blade 214, 220, 226 is longitudinally aligned with corresponding impeller blades 214, 220, 226 in the adjacent decks as is most apparent from FIG. 4. Each of the impeller blades 214, 220, 226 has a curved shape in a cross-sectional plane perpendicular to the bore longitudinal axis 204 for efficient discharge of air from the industrial fan assembly 10. At the same time, the impeller blades 214, 220, 226 extend generally radially outward relative to the bore longitudinal axis 204 from corresponding inner edges of the impeller rings 216, 222, 228. Those skilled in the art will understand that the impeller blades 214, 220, 226 may have alternative geometric configurations, and may even be flat or planar, and may have different orientations relative to the bore longitudinal axis 204.

During use, the impeller blades 214, 220, 226 are subjected to inertial loads and stress loads caused by the rotation of the components of the impeller 20 and the forces required to redirect the airflow. Additionally, thermal stresses are created due to the high temperature environment. With the thin profiles of the impeller blades 214, 220, 226, over time, the combination of stresses can cause the impeller blades 214, 220, 226 to flatten out, leading to decreased efficiency, imbalance causing vibration, and ultimately failure of the impeller blades 214, 220, 226.

To reduce the stresses experienced by the impeller blades 214, 220, 226, the impeller 20 in accordance with the present disclosure includes additional support structures. As seen in FIGS. 4 and 6, the impeller 20 includes a plurality of reinforcement bars 230 extending from and secured to the impeller baseplate 210 and to the third impeller ring 216. The reinforcement bars 230 are circumferentially spaced about the baseplate top surface and the third impeller ring bottom surface to preserve the balance of the impeller 20. There are fewer reinforcement bars 230 than impeller blades 214, 220, 226 in each impeller blade deck 212, 218, 224, and each reinforcement bar 230 is aligned with corresponding ones of the impeller blades 214, 220, 226 in each impeller blade deck 212, 218, 224.

The reinforcement bars 230 are engaged by and secured to the corresponding impeller blades 214, 220, 226. As a result, each group of impeller blades 214, 220, 226 in each impeller blade deck 212, 218, 224 has two types of impeller blades. Full impeller blades 232 (FIG. 6) are not aligned with any of the reinforcement bars 230, while reinforcement blades 234 are aligned with the reinforcement bars 230. The full impeller blades 232 extend radially outward to a position proximate the outer edges of the impeller rings 216, 222, 228, while the reinforcement blades 234 accommodate the reinforcement bars 230 that are positioned radially outward of the reinforcement blades 234 in the illustrated embodiment. Consequently, the reinforcement blades 234 have a shorter length than the full impeller blades 232 in the radial direction. As illustrated, each impeller blade deck 212, 218, 224 includes forty-eight total impeller blades 214, 220, 226, with forty-four being full impeller blades 232 and four being reinforcement blades 234 corresponding to the four reinforcement bars 230. Depending on the configuration of the impeller 20 and the requirements of an implementation of the industrial fan assembly 10, the impeller 20 may have more or fewer impeller blades 214, 220, 226 and reinforcement bars 230, and a ratio of the impeller blades 214, 220, 226 per impeller blade deck 212, 218, 224 to the reinforcement bars 230 of greater than or less than the 12-to-1 ratio in the present embodiment.

Figure 7:
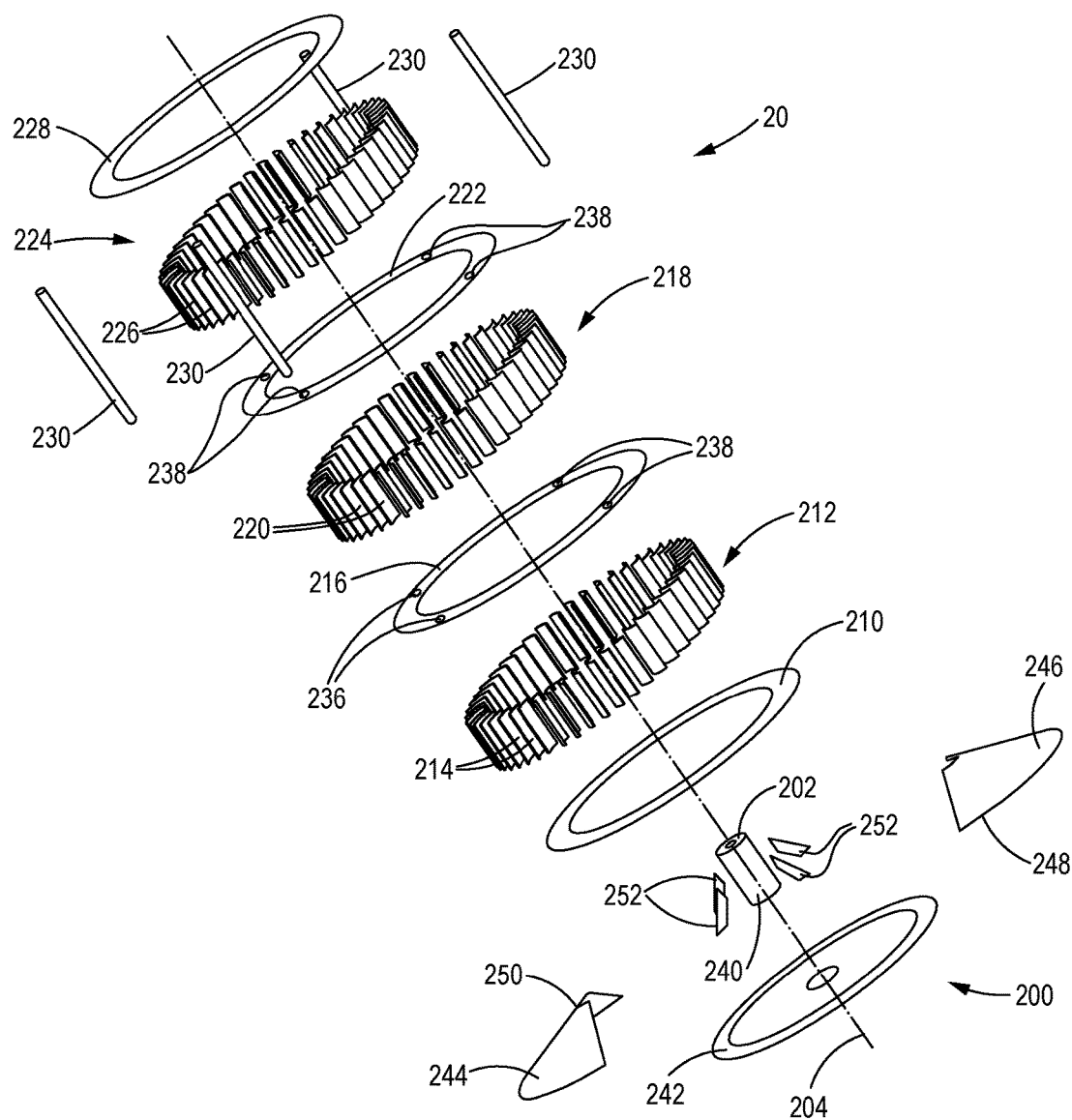
FIG. 7 is an isometric exploded view of the impeller of FIG. 4.

FIG. 7 presents an exploded view of the impeller 20 to further illustrate the configuration of the impeller rings 216, 222 and the reinforcement bars 230. The first impeller ring 216 has a plurality of first reinforcement bar apertures 236 and the second impeller ring 222 has a plurality of second reinforcement bar apertures 238 circumferentially spaced about the impeller rings 216, 222. During assembly, the reinforcement bar apertures 236, 238 are aligned and the reinforcement bars 230 are inserted there through and secured to the impeller rings 216, 222, the baseplate top surface and the third ring bottom surface by welding or other securement means. In alternative embodiments, the reinforcement bar apertures 236, 238 may be omitted and the reinforcement bars 230 may be replaced by shorter reinforcement bars having longitudinal links approximately equal to the longitudinal links of the impeller blades 214, 220, 226 and secured between the top and bottom surfaces of the impeller baseplate 210 and the impeller rings 216, 222, 228.

FIG. 7 also illustrates one embodiment of the impeller hub assembly 200. The impeller hub assembly 200 as shown includes an impeller hub 240 having a cylindrical shape, a hub outer surface and the hub shaft bore 202. The impeller hub assembly 200 further includes an impeller hub backplate 242 having a hub backplate top surface and a hub backplate bottom surface opposite the hub backplate top surface. The impeller hub 240 is mounted to and is concentric with the impeller hub backplate 242, and the hub backplate top surface is facing, secured to and concentric with the baseplate bottom surface. An impeller hub cone is formed by a first hub half cone 244 and a second hub half cone 246. When assembled, the impeller hub cone has a large diameter cone end 248 and a small-diameter cone end 250. The large diameter cone end 248 is secured to the hub backplate top surface and is concentric with the impeller hub 240 and the impeller hub backplate 242. The impeller hub 240 extends through the smaller diameter cone end 250. The shape of the impeller hub cone promotes redirection of the airflow from an axial airflow when the air is entering the fan housing inlet 46 and the impeller 20 to radial airflow to the impeller blades 214, 220, 226 and out of the fan housing outlet 48. The impeller hub assembly 200 may further include a plurality of hub gussets 252 that are circumferentially spaced about the impeller hub 240 and disposed between the hub backplate top surface and the impeller hub cone. The hub gussets 252 extend between and are secured to the hub outer surface and the hub backplate top surface. In alternative embodiments, the impeller hub cone could be a single unitary component, and the impeller baseplate 210 may be omitted and the reinforcement bars 230 and the impeller blades 214 of the first impeller blade deck 212 may be secured directly to the hub backplate top surface.

Figure 8:
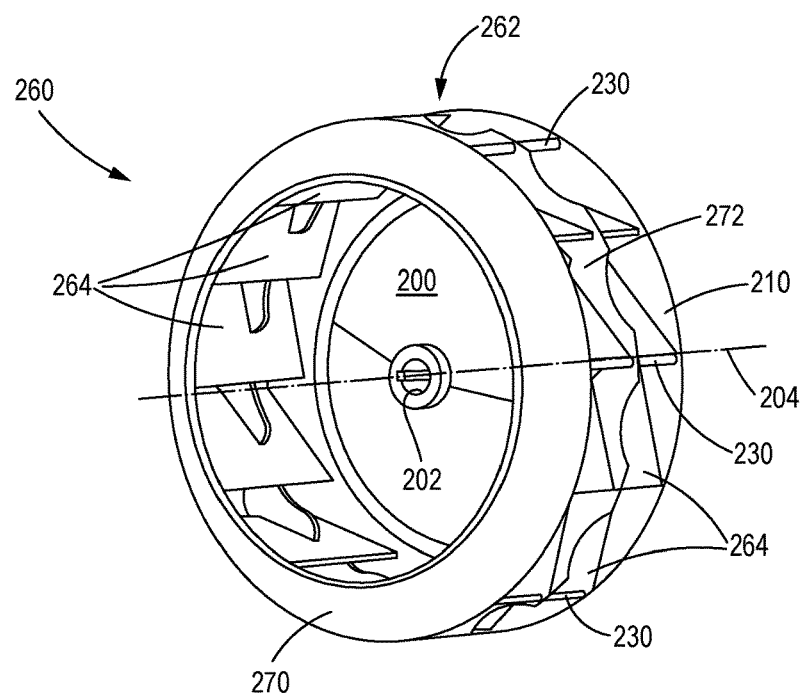
FIG. 8 is an isometric view of an alternative embodiment of an impeller of the industrial fan assembly of FIG. 1 in accordance with the present disclosure.
Figure 9:
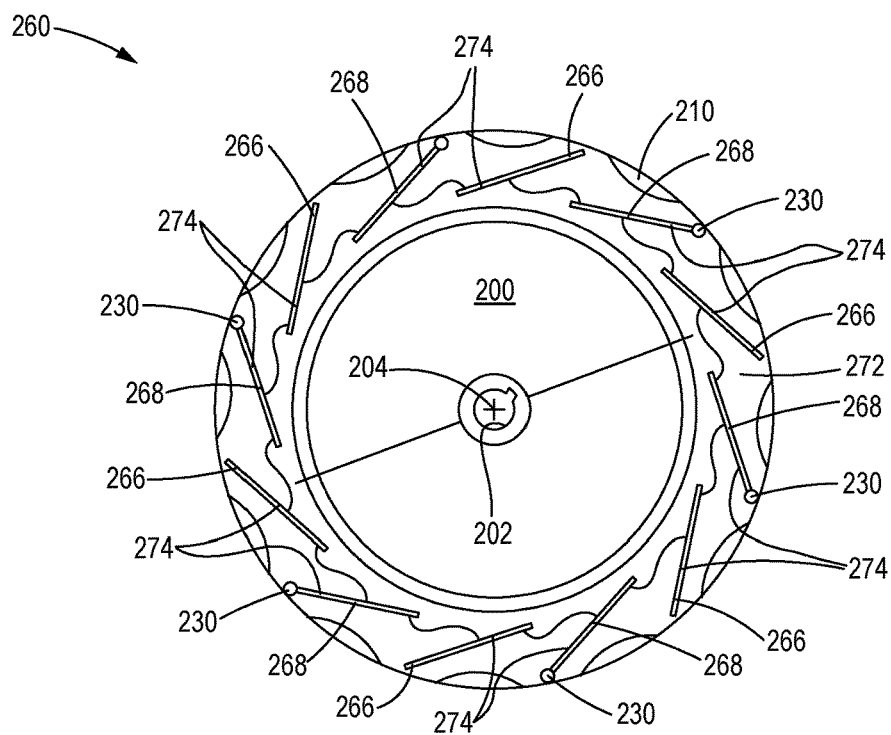
FIG. 9 is a top view of the impeller of FIG. 8 with an impeller ring removed to reveal an impeller blade deck.
Figure 10:
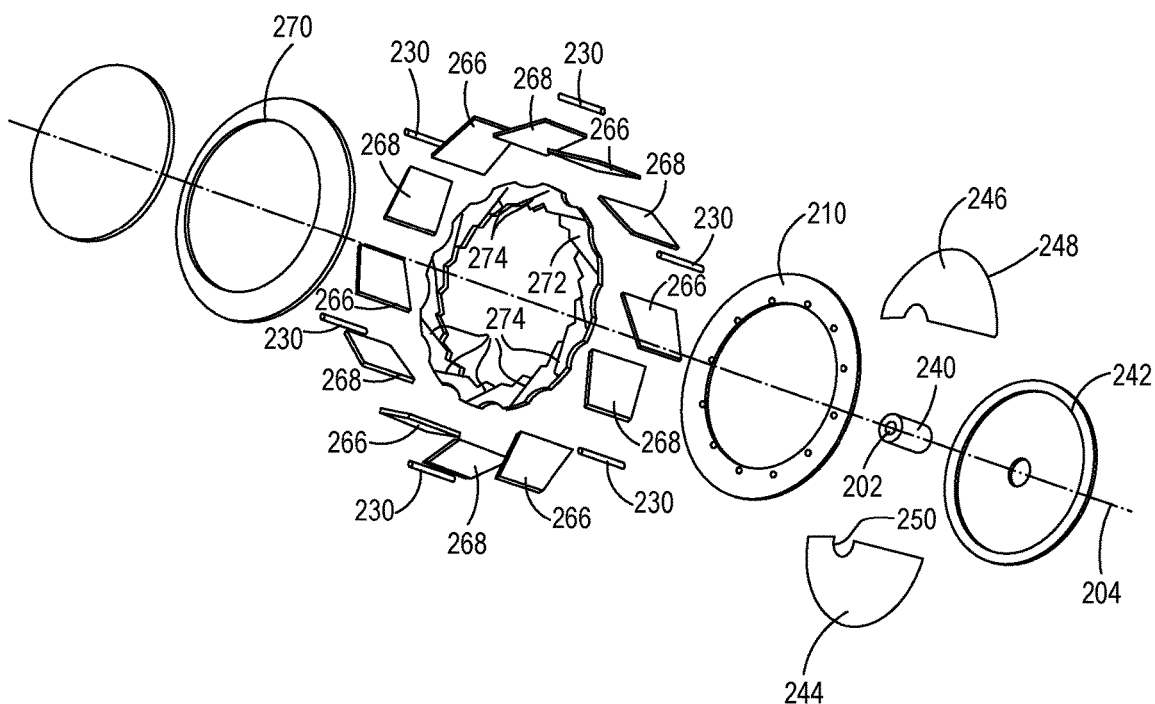
FIG. 10 is an isometric exploded view of the impeller of FIG. 8.

FIGS. 8-10 illustrate an alternative embodiment of an impeller 260 in the form of a backward inclined impeller having a single impeller blade deck 262 of a plurality of impeller blades 264. In this embodiment, components corresponding to components of the impeller 20 are identified with the same reference numerals, such as the impeller hub assembly 200, the impeller baseplate 210 and the reinforcement bars 230. In this embodiment, the impeller blades 264 are configured as thin plates oriented at an angle relative to radial lines extending outwardly from the bore longitudinal axis 204 and passing through the impeller blades 264 as shown in the top view of FIG. 9.

The number of reinforcement bars 230 is less than the number of impeller blades 264, so the impeller blade deck 262 includes full impeller blades 266 that are not aligned with the reinforcement bars 230, and reinforcement blades 268 aligned with the reinforcement bars 230 and being shorter than the full impeller blades 266. The reinforcement bars 230 extend to a bottom surface of an impeller ring 270 (FIG. 8) that has a conical shape that is apparent in FIGS. 8 and 10. To accommodate the conical shape of the impeller ring 270, the impeller blades 264 have an axial length that varies from a maximum at a radially inward most end to a minimum at a radially outward most end.

Due to their planar configuration and relatively large axial length, the impeller blades 264 may be more susceptible to deformation when subjected to torsional and thermal stresses during operation. The impeller blades 264 may be further reinforced by providing a blade support ring 272 between the impeller baseplate 210 and the impeller ring 270. The blade support ring 272 may have a blade slot 274 corresponding to each of the impeller blades 264, with the blade slots 274 being circumferentially spaced about the blade support ring 272. The blade support ring 272 may be positioned approximately halfway between the impeller baseplate 210 and the impeller ring 270 and welded or otherwise secured to the impeller blades 264 and the reinforcement bars 230. For each of the reinforcement blades 268, the corresponding blade slots 274 may be configured to have the reinforcement bar 230 pass through the blade support ring 272.

Figure 11:
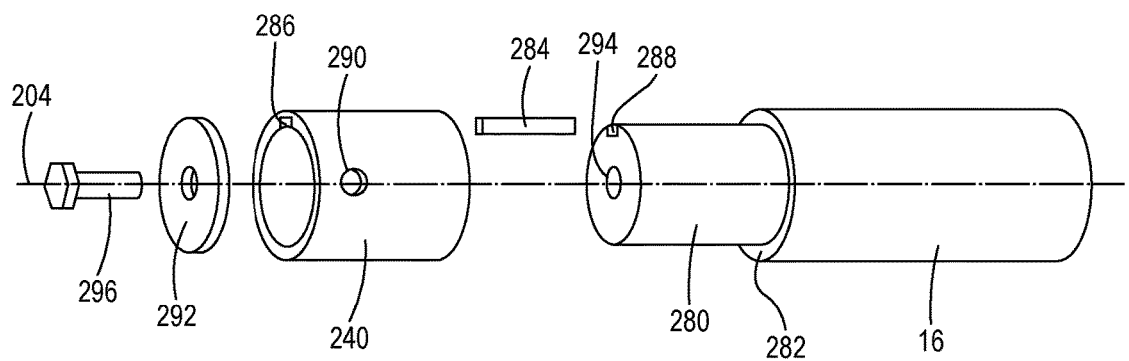
FIG. 11 is an isometric exploded view of a shaft end and an impeller hub of the industrial fan assembly of FIG. 1.

FIG. 11 illustrates an impeller attachment arrangement for securing the impellers 20, 260, and other impellers discussed herein can be reliably mounted to the first shaft end 114 of the fan shaft 16. The fan shaft 16 has a greater outer diameter than an inner diameter of the hub shaft bore 202. To be received into the hub shaft bore 202, the first shaft end 114 may have an impeller landing 280 machined down to an outer diameter that is less than the inner diameter of the hub shaft bore 202. The impeller landing 280 may have an axial length that is approximately equal to, or approximately ⅛" to ¼" less than, an axial length of the impeller hub 240, and terminate at an impeller landing shoulder 282. When one end of the impeller hub 240 slides onto the impeller landing 28 to the impeller landing shoulder 282, the first shaft end 114 will be approximately flush with or slightly recessed from the opposite end of the impeller hub 240. The key 284 will be disposed within a keyway 286 of the impeller hub 240 and a key seat 288 of the impeller landing 280 to lock the impeller hub 280 and the fan shaft 16 for rotation together.

Set screws (not shown) tightened down in set screw apertures 290 will substantially prevent the impeller hub 240 from sliding axially away from the impeller landing shoulder 282. Further positive retention in the axial direction may be provided by an impeller retention plate 292. The impeller retention plate 292 may have an outer diameter greater than the inner diameter of the hub shaft bore 202 so that an outer edge of the impeller retention plate 292 extends beyond the hub shaft bore 202 and engages the end of the impeller hub 240. A retention bolt opening 294 is drilled in the first shaft end 114 and receives an impeller retention bolt 296. After the first shaft end 114 is inserted through the hub shaft bore 202, the impeller retention plate 292 is bolted to the first shaft end 114 to capture the impeller hub 240 between the impeller landing shoulder 282 and the impeller retention plate 292.

FIGS. 12-15 illustrate an alternative embodiment of a centrifugal impeller 300 in accordance with the present disclosure that may be implemented in the industrial fan assemblies 10, 30 in the form of a radial blade impeller 300. The impeller 300 includes an impeller hub 302 that may have a similar configuration as the impeller hub 240 illustrated and described above with a cylindrical shape, a hub outer surface 304 and a hub shaft bore 306 with a hub longitudinal axis 308 about which the impeller 300 rotates. The impeller 300 further includes a plurality of impeller blade assemblies 310 (e.g., six in the illustrated embodiment) circumferentially spaced about, secured to and extending outward from the hub outer surface 304. Each of the impeller blade assemblies 310 has a leading blade assembly surface 312 facing a direction of rotation 314 (FIG. 13) of the impeller 300 and a trailing blade assembly surface 316 opposite the leading blade assembly surface 312.

Each impeller blade assembly 310 may be a single unitary component in some embodiments. In the illustrated embodiment, however, the impeller blade assemblies 310 are formed from multiple component elements. Each impeller blade assembly 310 includes a blade arm 320 and an impeller blade 322 connected thereto. Each blade arm 320 has an inward arm edge secured to the hub outer surface 304 and extends approximately radially outward to an outward arm edge. Each blade arm 320 has a leading arm surface facing the direction of rotation 314 and a trailing arm surface opposite the leading arm surface, and has oppositely disposed lateral arm edges having an arm width there between that is less than a longitudinal length of the impeller hub 302.

Each impeller blade 322 has a leading blade surface facing the direction of rotation 314 and a trailing blade surface opposite the leading blade surface and facing and engaging the leading arm surface of the corresponding blade arm 320. The impeller blades 322 are oriented with an inward blade edge proximate the hub outer surface 304, and with the impeller blades 322 extending approximately radially outward to an outward blade edge. The impeller blades 322 have oppositely disposed lateral blade edges having a blade width that is greater than or equal to the arm width.

The impeller blades 322 may be configured to efficiently draw air in through the fan housing inlet 46 and discharge air from the fan housing outlet 48. Each impeller blade 322 may include a blade tapered portion 324 (FIG. 15) proximate the blade inward edge and a blade rectangular portion 326 proximate the blade outward edge. In the blade tapered portion 324, the blade width between the blade lateral edges may increase as the blade tapered portion 324 extends away from the blade inward edge and the hub outer surface 304. In the blade rectangular portion 326, the blade width may be constant as the blade rectangular portion 326 extends radially outward from the blade tapered portion 324 to the blade outward edge. Within the blade rectangular portion 326, an impeller blade bend 328 parallel to the hub longitudinal axis 308 may rotate the blade outward edge forward toward the direction of rotation 314 by an angle θ (FIG. 14). Depending on the implementation, the angle θ may be within the range from 10° to 40°, and may typically be approximately 30°. Forming the impeller blade bend 328 with the angle θ in the direction of rotation 314 may increase the overall strength of the impeller blades 322, and help prevent deformation or effects of the impeller blades 322 losing their straight edges due to torsional stresses or deformation cause by continuous operation in high temperature, chemical or highly corrosive processes.

The impeller 300 in accordance with the present disclosure includes additional support structures to reinforce the impeller blade assemblies 310 against torsional and thermal loads experienced during operation, particularly in high temperature environments. A first support structure is provided in the form of a plurality of blade gussets 330. Each blade gusset 330 is disposed between adjacent impeller blade assemblies 310, and includes a gusset base 332, a long gusset arm 334 and a short gusset arm 336. The gusset base 332 engages and is secured to a corresponding portion of the hub outer surface 304 as best seen in FIG. 14. The long gusset arm 334 extends radially outward from a leading side of the gusset base 332 and engages and is secured to the trailing blade assembly surface 316 of one of the impeller blade assemblies 310. The short gusset arm 336 extends radially outwardly from a trailing side of the gusset base 332 and engages and is secured to the leading blade assembly surface 312 of the adjacent impeller blade assembly 310 in the trailing direction.

In the illustrated embodiment, the long gusset arms 334 are secured to the trailing arm surfaces of the blade arms 320. The short gusset arms 336 may be secured to the leading surfaces of the blade arms 320, the impeller blades 322, or both. As shown in FIGS. 12 and 15, each of the impeller blades 322 has a gusset arm slot 338 extending upward from the inward blade edge by a distance sufficient for the gusset arm slot 338 to receive the short gusset arm 336 there in. The gusset arm slot 338 allows the short gusset arm 336 to engage the leading arm surface of the blade arm 320, and then the short gusset arm 336 may be welded to the blade arm 320 and/or the impeller blade 322.

As the impeller 300 rotates in the direction 314, the force of the air creates loads on the impeller blade assemblies 310 in the opposite direction. The long gusset arms 334 assist in counteracting such loads. Moreover, when installed, the blade gussets 330 may be substantially axially aligned with respect to each other so that the long gusset arm 334 of one blade gusset 330 is aligned with the short gusset arm 336 on the opposite side of the impeller blade assembly 310. This arrangement provides a unitizing structure whereby the blade arms 320 and the blade gussets 330 define a continuous support disk for the impeller blade assemblies 310 around the impeller hub 302.

Additional structural support may be provided by a pair of hub sprockets 340 disposed on either end of the impeller hub 302 and engaging the impeller blade assemblies 310. Each of the hub sprockets 340 is generally circular with a central sprocket opening 342 (FIG. 15) having an inner diameter large enough for the hub sprocket 340 to slide over one end of the impeller hub 302. Each hub sprocket 340 further has a sprocket outer edge 344 having a plurality of sprocket teeth 346 extending radially outward from and circumferentially spaced about the sprocket outer edge 344. The number of sprocket teeth 346 corresponds to the number of impeller blades 322, i.e., six in the illustrated embodiment. This allows each sprocket tooth 346 to align with and provide support to one of the impeller blade assemblies 310.

After the blade arms 320 are welded or otherwise secured to the hub outer surface 304, one of the hub sprockets 340 may slide over a corresponding end of the impeller hub 302. The hub sprocket 340 may then be rotated until the sprocket teeth 346 aligned with the impeller blade assemblies 310. Once aligned, the hub sprocket 340 may be pressed against the corresponding lateral arm edges of the blade arms 320 and secured thereto by welds or other appropriate securement means. The second hub sprocket 340 may be installed on the opposite end of the impeller hub 302 in a similar manner. In some embodiments, the impeller blades 322 may be configured so that the inward blade edge and/or lateral blade edges are also engaged by and secured to the sprocket teeth 346. The sprocket teeth 346 will provide additional support to the impeller blade assemblies 310 against loads applied opposite the direction of rotation 314, and against loads tending to twist the impeller blade assemblies 310. The hub sprockets 340 help to reinforce the areas of highest stress concentrations and add stability to the blade arms 320. The additional support can prevent cracking between the blade arms 320 and the hub outer surface 304, which tends to be an area with a high occurrence of failure in high temperature and corrosive environments, and a correspondingly high repair and replacement rate for previous radial blade impellers.

Figure 18:
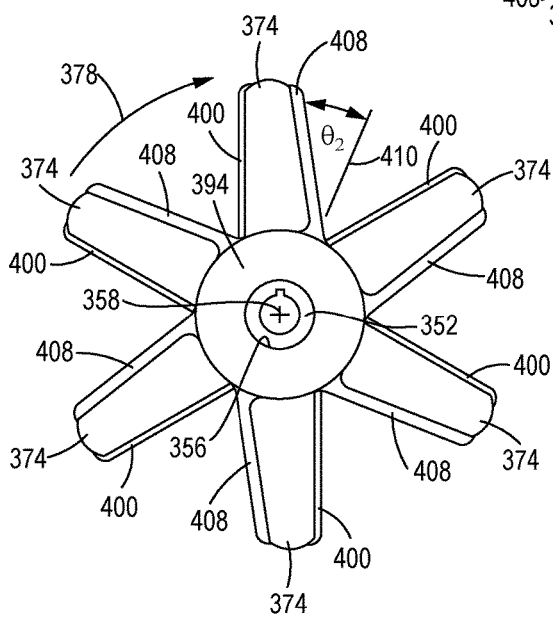
FIG. 18 is an opposite end view of the impeller of FIG. 16.
Figure 19:
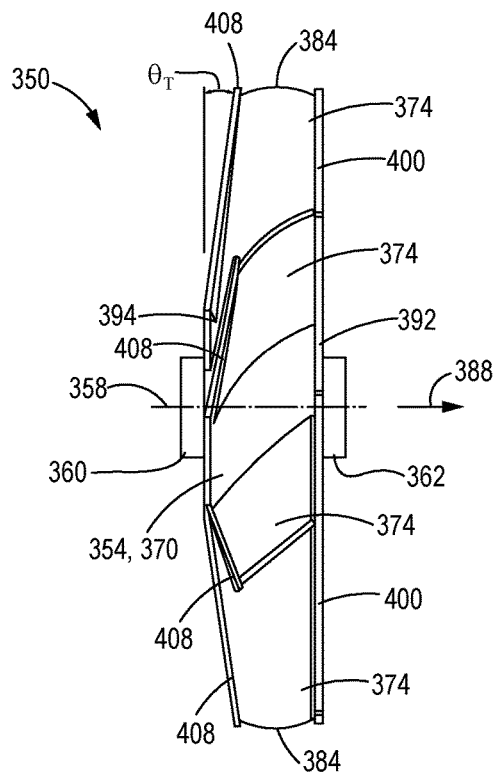
FIG. 19 is a side view of the impeller of FIG. 16.
Figure 20:
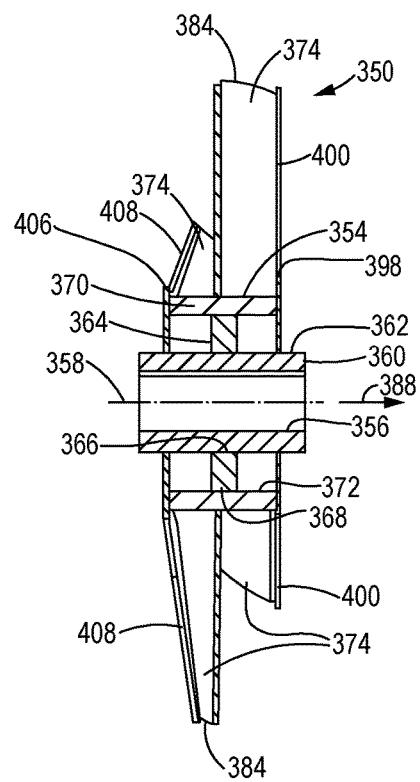
FIG. 20 is a cross-sectional view of the impeller of FIG. 16 taken through line 20-20 of FIG. 17.
Figure 21:
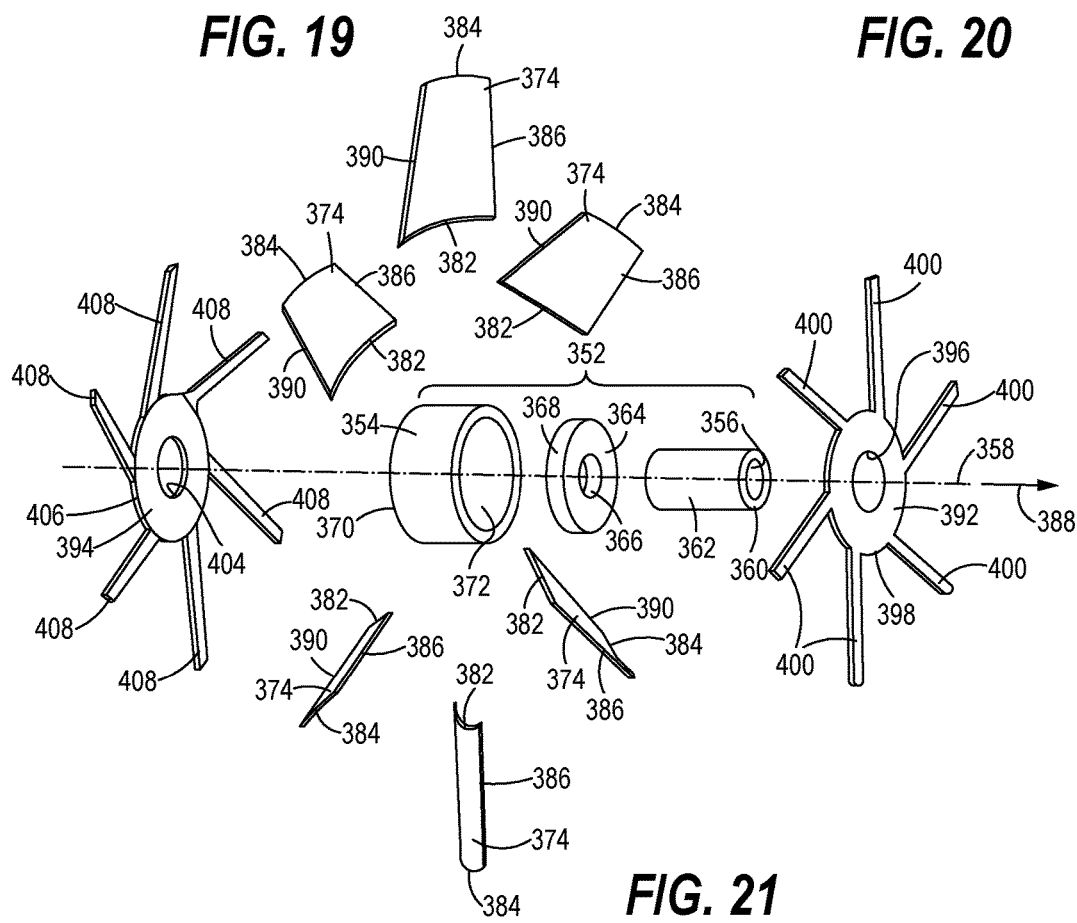
FIG. 21 is an isometric exploded view of the impeller of FIG. 16.

FIGS. 16-21 illustrate an embodiment of an axial impeller 350 in accordance with the present disclosure that may be implemented in the industrial fan assemblies 10, 30. The fan housing 44 would be replaced by an appropriate axial fan housing that would promote axial airflow into and out of the impeller 350. The impeller 350 includes an impeller hub assembly 352 having a cylindrical shape, a hub assembly outer surface 354 and a hub shaft bore 356 having a hub longitudinal axis 358. In some embodiments, the impeller hub assembly 352 may be a single unitary component that is forged, cast, machined or otherwise fabricated from a single piece of material. In contrast, in the illustrated embodiment as shown in FIG. 21, the impeller hub assembly 352 may be assembled from multiple components that may be fabricated from a single or multiple construction materials to form the central structure of the impeller 350. As shown, the impeller hub assembly 352 includes an impeller hub 360 having a cylindrical shape, a hub outer surface 362, the hub shaft bore 356 with the hub longitudinal axis 358, and a hub longitudinal length. The impeller hub assembly 352 may further include a hub center plate 364 having a center plate inner edge 366, a center plate outer edge 368, and a hub center plate thickness that is less than the hub longitudinal length. The hub center plate 364 is disposed on the impeller hub 360 with the center plate inner edge 366 engaging and secured to the hub outer surface 362. As shown in FIG. 20, the hub center plate 364 may be located at approximately a longitudinal center point of the impeller hub 360.

Returning to FIG. 21, the impeller hub assembly 352 may further include a hub outer cylinder 370 having an outer cylinder inner surface 372, the hub assembly outer surface 354, and an outer cylinder longitudinal length that is greater than the hub center plate thickness and less than the hub longitudinal length. The hub outer cylinder 370 is disposed on the hub center plate 364 and around the impeller hub 360. The outer cylinder inner surface 372 of the hub outer cylinder 370 engages and is secured to the center plate outer edge 368. The hub center plate 364 may be disposed within the hub outer cylinder 370 at approximately a longitudinal center point of the hub outer cylinder 370 (FIG. 20). With this configuration, ends of the impeller hub 360 may extend longitudinally beyond the corresponding ends of the hub outer cylinder 370.

Figure 16:
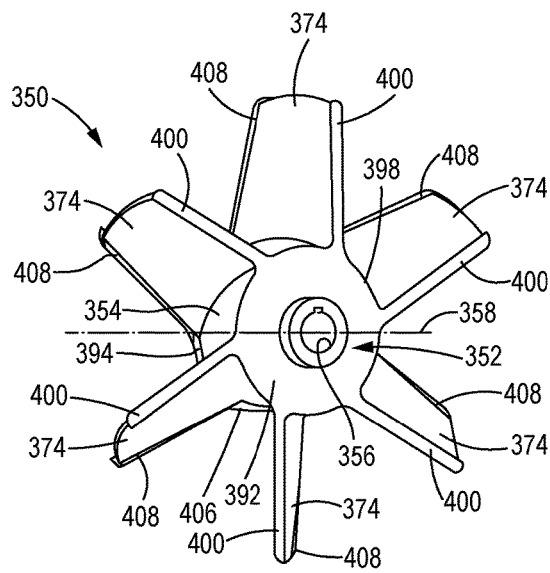
FIG. 16 is an isometric view of a further alternative embodiment of an impeller of the industrial fan assembly of FIG. 1 in accordance with the present disclosure.
Figure 17:
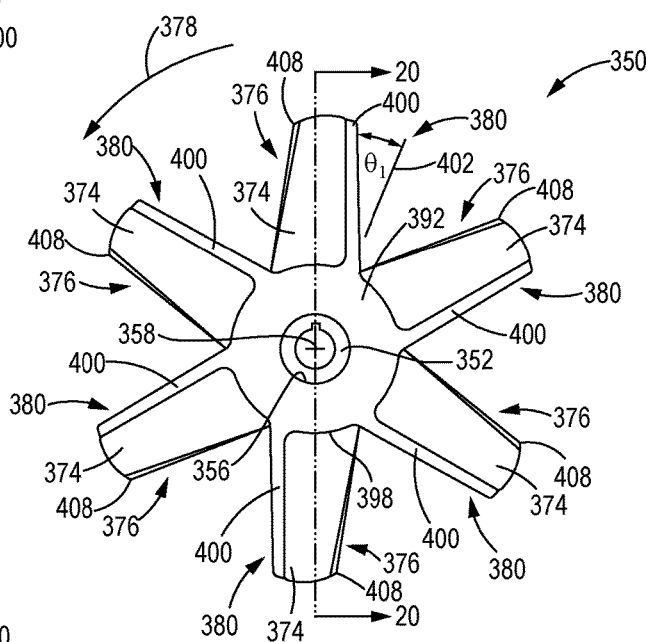
FIG. 17 is an end view of the impeller of FIG. 16.

FIG. 16 further illustrates the impeller 350 having a plurality of impeller blades 374 circumferentially spaced about the hub assembly outer surface 354. Each of the impeller blades 374 has a leading blade surface 376 (FIG. 17) facing a direction of rotation 378 of the impeller 350, and a trailing blade surface 380 opposite the leading blade surface 376. Each of the impeller blades 374 further has an inward blade edge 382 (FIG. 21) secured to the hub assembly outer surface 354, and the impeller blades 374 extend outward to outward blade edges 384 that are opposite the inward blade edges 382. A first or downstream lateral blade edge 386 is disposed on a downstream side of the impeller 350 relative to an airflow direction 388 created when the impeller 350 rotates in the direction of rotation 378 (FIGS. 17 and 18). A second or upstream lateral blade edge 390 is disposed opposite the downstream lateral blade edge 386 on an upstream side of the impeller 350. The impeller blades 374 are curved, and in some implementations are slightly twisted into a formed fixture, to promote airflow in the airflow direction 388 and reduce stall and turbulence as the impeller 350 rotates in the direction of rotation 378.

In previous axial impellers used in high temperature environments, impeller blades similar to those illustrated and described herein can tend to flatten and bend, and thereby reduce the airflow efficiency of and cause vibrations in the industrial fan assemblies 10, 30, make the airflow non-uniform, raise the static pressures, and increase the noise generated by the industrial fan assemblies 10, 30. Moreover, over time, cracks can develop at high stress areas found at the point of attachment of the impeller blades 374 to the hub assembly outer surface 354. Vibration can lead to blade fatigue and the impeller blades 374 can detach from the hub assembly outer surface 354 and project from the impeller 350 as welds or other fastening systems and the impeller blades 374 themselves fail. In addition, dirt, soot, loose insulation, process heat by-products or other types of air stream debris can accumulate within the impeller hub assembly 352 in the area between the hub outer surface 362 and the outer cylinder inner surface 372 and cause imbalance in the impeller 350 that can further contribute to vibrations and failure of the impeller 350. The impeller 350 in accordance with the present disclosure provides additional structural support and reinforcement of the impeller blades 374 that can extend the useful life of the impeller 350. The structural support may be provided by a first or downstream cover plate 392 and a second or upstream cover plate 394.

The first cover plate 392 is disposed on a downstream end of the impeller hub 360 and engages the hub outer cylinder 370. The first cover plate 392 is generally circular with a central cover plate opening 396 having an inner diameter large enough for the first cover plate 392 to slide over the downstream end of the impeller hub 360. The first cover plate 392 further has a first cover plate outer edge 398 having a cover plate outer diameter that is at least greater than an inner diameter of the outer cylinder inner surface 372 to prevent debris from entering and collecting in the downstream end of the impeller hub assembly 352. The flat outer surface of the first cover plate 392 may be flat and relatively smooth so that air stream debris in the airflow will not adhere to the first cover plate 392. The first cover plate 392 may also add strength to the hub outer cylinder 370. In previous axial blade impellers, extreme stresses associated with thermal and torsional stresses can increase downward of from the impeller blades to the center of rotation. Many times, the hub outer cylinder 370 and/or the impeller hub 360 will become deformed or will lose their round shape and deform into an "egg" or other non-symmetrical shape that will cause vibration. The first cover plate 392 supports the impeller hub assembly 352 to preserve the round, symmetrical shape. As shown in the illustrated embodiment in FIG. 20, the cover plate outer diameter may be greater than a hub assembly outer diameter of the impeller hub assembly 352 so that a portion of the first cover plate 392 extends beyond the hub assembly outer surface 354 and engages the first lateral blade edges 386 proximate the inward blade edges 382. The overlapping portions of the first cover plate 392 and the first lateral blade edges 386 may be welded or otherwise secured so that the first cover plate 392 supports a portion of the impeller blades 374.

The first cover plate 392 as illustrated further includes a plurality of first cover plate arms 400 extending outward from and circumferentially spaced about the first cover plate outer edge 398. The number of first cover plate arms 400 corresponds to the number of impeller blades 374, i.e., six in the illustrated embodiment. This allows each first cover plate arm 400 to align with and provide support to one of the impeller blades 374 when the first cover plate arm 400 is secured to the first lateral blade edge 386 of the impeller blades 374. In the present embodiment, the first cover plate arms 400 extend the length of the impeller blades 374 to the outward blade edges 384, and beyond the outward blade edges 384, to provide support to the entire length of the impeller blades 374 without disrupting the airflow and maintaining axial airflow velocity uniform along the radial length of the impeller blades 374. In axial impeller blades 374, the velocity is low near the hub assembly outer surface 354 and at a maximum at the outward blade edges 384 where flattening of the impeller blades 374 may begin to occur. The extension of the first cover plate arms 400 and corresponding support at the outward blade edges 384 can greatly reduce the overall flattening of the impeller blades 374.

The first cover plate arms 400 are oriented to follow the direction of the first lateral blade edges 386 of the impeller blades 374. As shown in FIG. 17, the first cover plate arms 400 extend from the first cover plate outer edge toward the direction of rotation of the impeller 350. The extension of the first cover plate arms 400 may be expressed as a first plate arm angle $\theta_1$ relative to a radial line 402 from the hub longitudinal axis 358. The first plate arm angle $\theta_1$ may have a value within a range from 20° to 30°. In the illustrated embodiment, the first plate arm angle $\theta_1$ is approximately equal to 23°.

The second cover plate 394 is disposed on an upstream end of the impeller hub 360 and engages the hub outer cylinder 370. The second cover plate 394 has a configuration that is generally similar to the configuration of the first cover plate 392, including a central cover plate opening 404 that slides over the upstream end of the impeller hub 360, and a cover plate outer edge 406 having the cover plate outer diameter to cover the upstream end of the impeller hub assembly 352, to extend beyond the hub assembly outer surface 354 and to engage the second lateral blade edges 390 proximate the inward blade edges 382. A smooth relatively flat outer surface that prevents buildup of air stream debris on the impeller hub 360, and the engagement of the second cover plate 394 with the hub outer cylinder 370 reinforces the impeller hub assembly 352 to preserve its round, symmetrical shape and prevent unwanted vibration. Six second cover plate arms 408 extend outward from and are circumferentially spaced about the second cover plate outer edge 406, and extend the length of the impeller blades 374 to the outward blade edges 384.

The second cover plate arms 408 are oriented to follow the direction of the second lateral blade edges 390 of the impeller blades 374. As shown in FIG. 18, the second cover plate arms 408 extend from the second cover plate outer edge away from the direction of rotation 378 of the impeller 350. The extension of the second cover plate arms 408 may be expressed as a second plate arm angle $\theta_2$ relative to a radial line 410 from the hub longitudinal axis 358. Due to the curvature of the impeller blades 374, the second plate arm angle $\theta_2$ may be greater than the first plate arm angle $\theta_1$.

Consequently, the second plate arm angle $\theta_2$ may have a value within a range from 25° to 40°. In the illustrated embodiment, the second plate arm angle $\theta_2$ is approximately equal to 31°.

As can be seen in FIG. 19, the curvature of the impeller blades 374 may cause the longitudinal depth of the impeller blades 374 to decrease as the impeller blades 374 extend away from the hub assembly outer surface 354. In the illustrated embodiment, the first lateral blade edges 386 have an approximately constant longitudinal position between the inward blade edge 382 and the outward blade edge 384. The second lateral blade edges 390 move longitudinally toward the first lateral blade edges 386 as the impeller blades 374 extend away from the hub assembly outer surface 354. Consequently, the second cover plate arms 408 extend from the second cover plate outer edge 406 at a second plate arm taper angle $\theta_T$ so that a longitudinal distance between the second cover plate arms 408 and the first cover plate arms 400 decreases as the second cover plate arms 408 extend from the second cover plate outer edge 406. The second plate arm taper angle $\theta_T$ may have a value within a range from 5° to 10°.

In many implementations, the impellers 20, 260, 300, 350 are disposed within the high temperature or corrosive environments, while the fan mount assembly 12, the motor 14 and the transmission 18 are disposed in an ambient environment outside the high temperature environment, separated by an insulating structure such as the insulation dam assembly 22. However, because the fan shaft 16 must traverse the boundary between the high temperature and Ambien environments and be able to rotate to drive the impellers 20, 260, 300, 350, heat transfer can occur at the interface where it may be preferable to thermally isolate the environments. Moreover, the high temperature environment in some implementations may have potentially hazardous gases or particulate matter that should not be permitted to be released into the ambient atmosphere. In some implementations, a controlled atmosphere may be utilized in the process performed within the controlled system, and ambient infiltration may yield non-desired results in the process or embrittlement to the finished products. In some processes, a chemical or gas such as nitrogen may be used in the process, such as a heat treating process, and may be injected or otherwise introduced into the high temperature environment to create a positive pressure in the system. Leakage of the chemical or gas from the enclosed system to the ambient surroundings through the fan shaft interface can yield undesired results within the process and create a potential hazard to the area surrounding the controlled system. Therefore, minimizing heat and material transmission across the interface may be a requirement in certain implementations of the industrial fan assemblies 10, 30.

Figure 22:
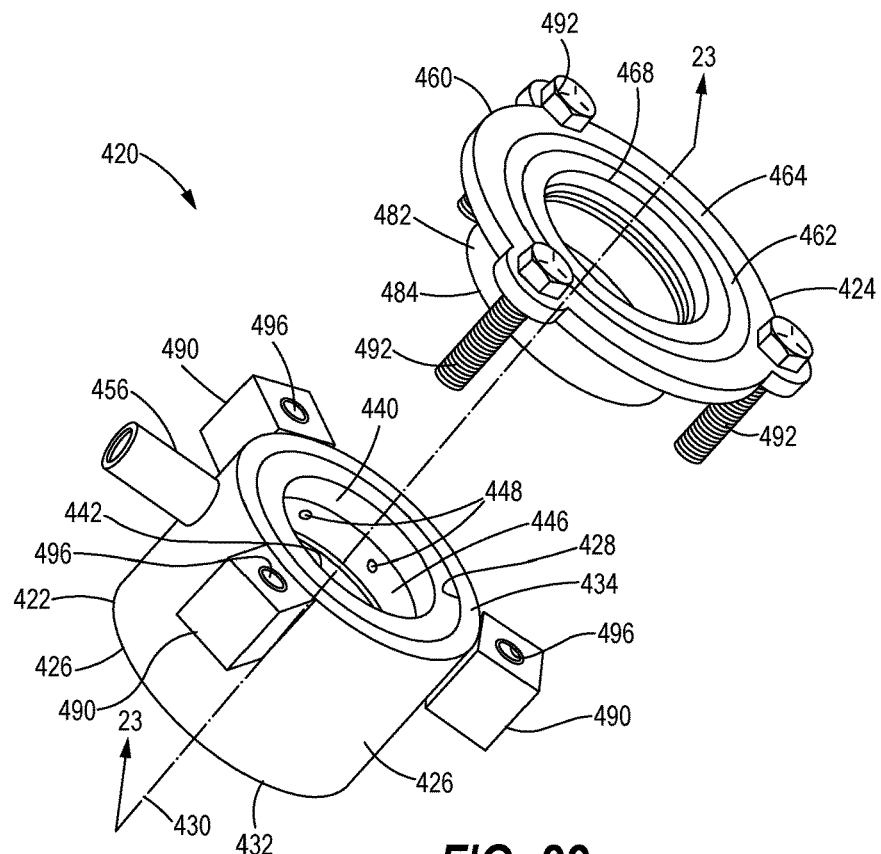
FIG. 22 is an isometric exploded view of a rotary seal in accordance with the present disclosure for the industrial fan assemblies of FIGS. 1 and 2.
Figure 23:
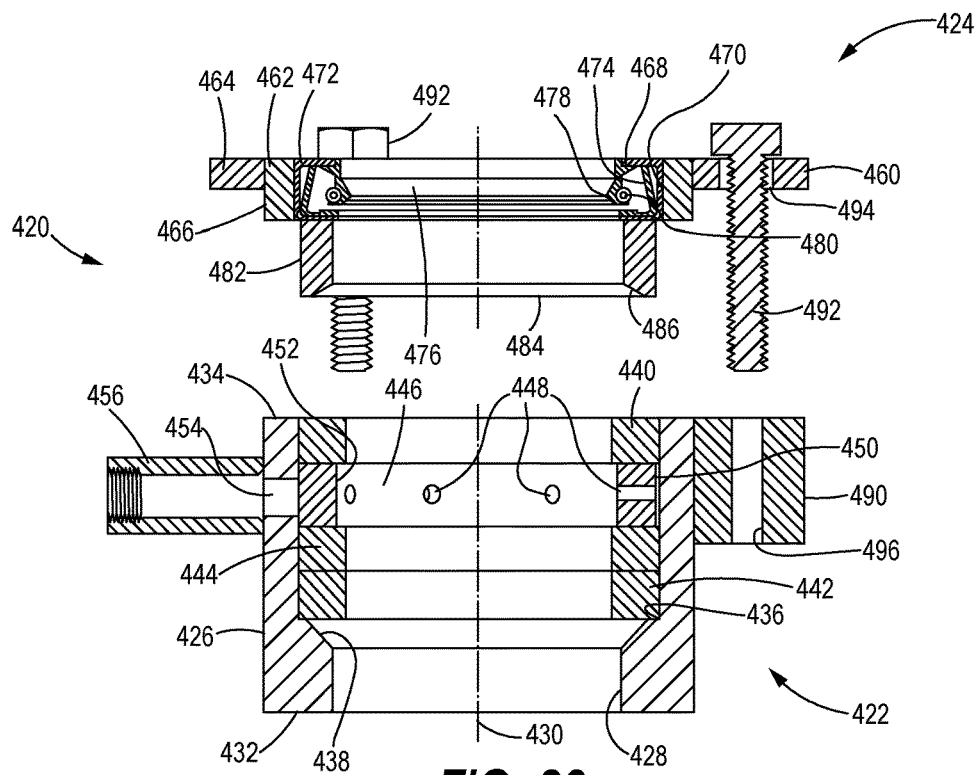
FIG. 23 is a cross-sectional view of the rotary seal of FIG. 22 taken through line 23-23 of FIG. 22.

FIGS. 22-25 illustrate an exemplary rotary seal 420 that may be installed at a shaft opening through the insulation dam assembly 22 of the industrial fan assembly 10 to isolate the high temperature environment and its associated heating and/or chemical process from the ambient environment. Referring to FIG. 22, the rotary seal 420 may include a seal housing 422, and a seal cover 424 that may close the rotary seal 420 after the fan shaft 16 is inserted through the shaft opening. The seal housing 422 as illustrated may be generally cylindrical, and has a seal housing outer surface 426, a seal housing inner surface 428 (FIG. 23) defining a seal housing bore having a rotary seal longitudinal axis 430. The seal housing 422 further includes a seal housing mounting end 432 secured to the stationary structure about a shaft opening through the stationary structure. A seal housing sealing end 434 is disposed opposite the seal housing mounting end 432.

The seal housing inner surface 428 shapes the seal housing bore to receive the ceiling structures of the rotary seal 420. The seal housing inner surface 428 may extend longitudinally from the seal housing sealing end 434 with an approximately constant seal housing bore inner diameter. As the seal housing inner surface 428 approaches the seal housing mounting end 432, the seal housing inner surface 428 extends radially inward to form a seal housing bore shoulder 436. As the seal housing inner surface 428 continues to extend toward the seal housing mounting end 432, the seal housing bore may have a seal housing bore tapered portion 438 with the seal housing bore inner diameter decreasing as the seal housing inner surface 428 extends axially from the seal housing bore shoulder 436 toward the seal housing mounting end 432.

The seal housing 422 may have a plurality of seal rings 440, 442, 444 disposed within the seal housing bore. The first seal ring 440 may be disposed proximate the seal housing sealing end 434. The second seal ring 442 may be disposed proximate the seal housing mounting end 432 and engaged by the seal housing bore shoulder 436. The seal housing bore outer diameter of the seal housing bore at the seal housing bore shoulder 436 is less than a seal ring outer diameter of the seal rings 440, 442, 444 so that the seal housing bore shoulder 436 prevents the second seal ring 442 from passing out of the seal housing bore through the seal housing mounting end 432. The third seal ring 444 may be disposed between the first seal ring 440 and the second seal ring 442.

The seal rings 440, 442, 444 may be fabricated from a resilient material that is compressible by the seal cover 424. For example, the seal rings 440, 442, 444 may be fabricated from graphite rope formed into annuli with the seal ring outer diameter allowing the seal rings 440, 442, 444 to be inserted within the seal housing bore, and a seal ring inner diameter that allows the fan shaft 16 to be inserted there through. Material such as graphite rope allow the seal rings 440, 442, 444 to form seals with the seal housing inner surface 428 and the shaft outer surface of the fan shaft 16 as discussed further below, while having a low coefficient of friction to allow the fan shaft 16 to rotate with minimal reduction in efficiency of the industrial fan assembly 10.

The seal housing 422 further includes a cavity ring 446 disposed within the seal housing bore between the first seal ring 440 and the third seal ring 444. The cavity ring 446 has a cavity ring outer diameter that is less than the seal housing bore inner diameter, and a cavity ring inner diameter that is greater than the shaft outer diameter of the fan shaft 16. The cavity ring 446 has a plurality of cavity ring inlet passages 448 extending through the cavity ring 446 from a cavity ring outer surface 450 to a cavity ring inner surface 452. The seal housing 422 has a pressurized inlet passage 454 extending through the seal housing 422 from the seal housing outer surface 426 to the seal housing inner surface 428. The cavity ring 446 is aligned with the pressurized inlet passage 454 so that the pressurized inlet passage 454 and the cavity ring inlet passages 448 may place the cavity ring inner surface 452 and a corresponding portion of the fan shaft 16 in fluid communication with a pressurized air or fluid source (not shown) fluidly connected to the pressurized inlet passage 454. A pressurized inlet connector 456 may be mounted on the seal housing outer surface 426 around the pressurized inlet passage 454 to provide a point of connection for a conduit connecting the pressurized air or fluid source with the rotary seal 420.

The seal cover 424 may be formed from several components to facilitate forming seals within the seal housing bore, and providing additional sealing around the fan shaft 16 external to the seal housing bore. The seal cover 424 includes a seal cover flange 460 formed by a seal cover inner ring 462 having an annular shape, and a seal cover outer ring 464 having a generally annular shape mounted on an inner ring outer surface 466. The seal cover 424 may further include a lip seal 468 mounted within an inner ring inner surface 470 of the seal cover inner ring 462. The lip seal 468 may have a compound structure including a lip seal outer bracket 472 secured to the inner ring inner surface 470, a lip seal inner bracket 474 disposed within the lip seal outer bracket 472 and providing additional structural support, and a lip seal sealing ring 476 mounted to the lip seal outer bracket 472, the lip seal inner bracket 474, or both. The lip seal sealing ring 476 may be formed from a resilient material and have an annular shaft engaging edge 478 that will engage the shaft outer surface to form a lip seal ring seal there between when the fan shaft 16 is inserted through the seal cover 424. A lip seal tension band 480 may be disposed on the lip seal sealing ring 476 opposite the shaft engaging edge 478 and formed from a stiffer material than the lip seal sealing ring 476 to create extra sealing force against the shaft outer surface in the lip seal ring seal.

The seal cover 424 further includes a seal cover compression ring 482 having a hollow cylindrical shape and extending downward from the seal cover flange 460. The seal cover compression ring 482 has a compression ring outer diameter that is less than the seal housing bore outer diameter proximate the seal housing sealing end 434 so that the seal cover compression ring 482 can be inserted into the seal housing bore and engage the first seal ring 440. The seal cover compression ring 482 has a seal ring engagement end 484 opposite the seal cover flange 460. At a compression ring inner surface tapered portion 486 at the seal ring engagement end 484, a compression ring inner diameter may decrease as the compression ring inner surface tapered portion 486 extends axially away from the seal ring engagement end 484.

The rotary seal 420 also includes a seal cover anchor mechanism engaging the seal cover 424 and the seal housing 422 to secure the seal cover 424 to the seal housing 422. The seal cover anchor mechanism causes the seal cover compression ring 482 to compress the seal rings 440, 442, 444 and cause the seal rings 440, 442, 444 to engage the seal housing inner surface 428 to create a seal ring outer seal there between, and to engage the shaft outer surface of the fan shaft 16 to create a seal ring inner seal there between while allowing the fan shaft 16 to rotate relative to the seal rings 440, 442, 444. In the illustrated embodiment, the seal cover anchor mechanism includes a plurality of anchor blocks 490 mounted on and circumferentially spaced around the seal housing outer surface proximate the seal housing sealing end 434. The seal cover anchor mechanism further includes a plurality of anchor bolts 492 extending through anchor bolt apertures 494 that are circumferentially spaced around the seal cover flange 460. Each of the anchor bolts 492 corresponds to one of the anchor blocks 490 and is received within an anchor block aperture 496 of the corresponding anchor block 490 and tighten therein to compress the seal rings 440, 442, 444 as described below. Because the rotary seal 420 is used for extended periods of time, the seal rings 440, 442, 444 can wear from friction over time. The compression on the seal rings 440, 442, 444 can be increased as necessary over time by tightening the anchor bolts 492 in the anchor blocks 490. This may increase the service life and minimize the maintenance required on the rotary seal 420 by extending the useful lives of the seal rings 440, 442, 444. Moreover, the ability to adjust the compression on the seal rings 440, 442, 444 can increase the effectiveness of the rotary seal 420 in preventing unwanted gas and material flow across the interface and reduce maintenance requirements and undesirable process shut downs.

Figure 24:
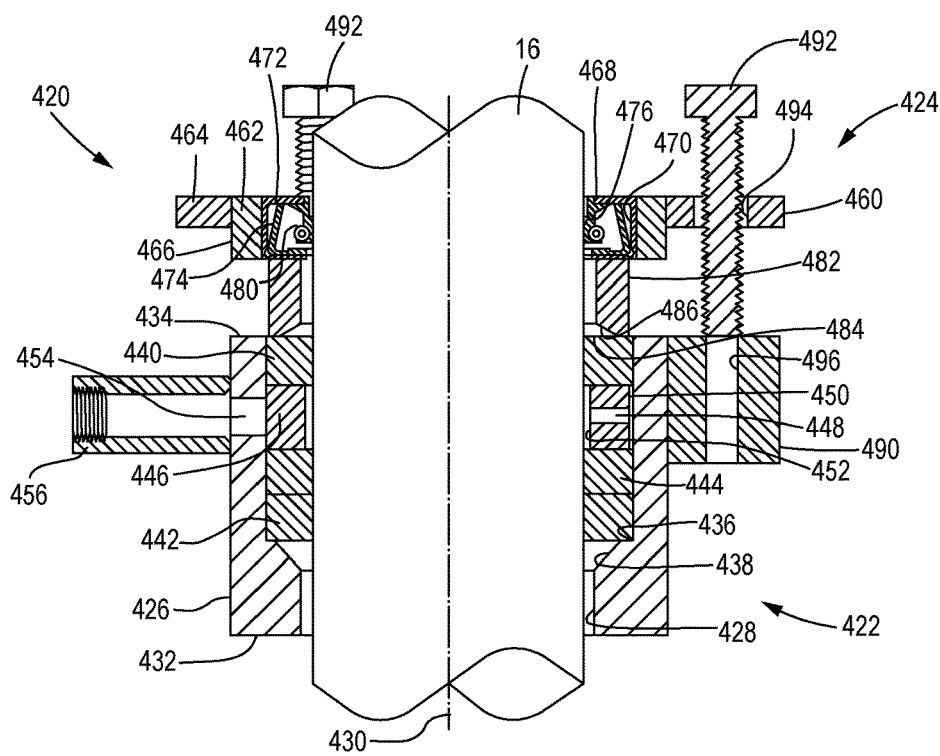
FIG. 24 is the cross-sectional view of the rotary seal of FIG. 23 with a fan shaft inserted through the rotary seal and with a seal cover detached from a seal housing of the rotary seal.
Figure 25:
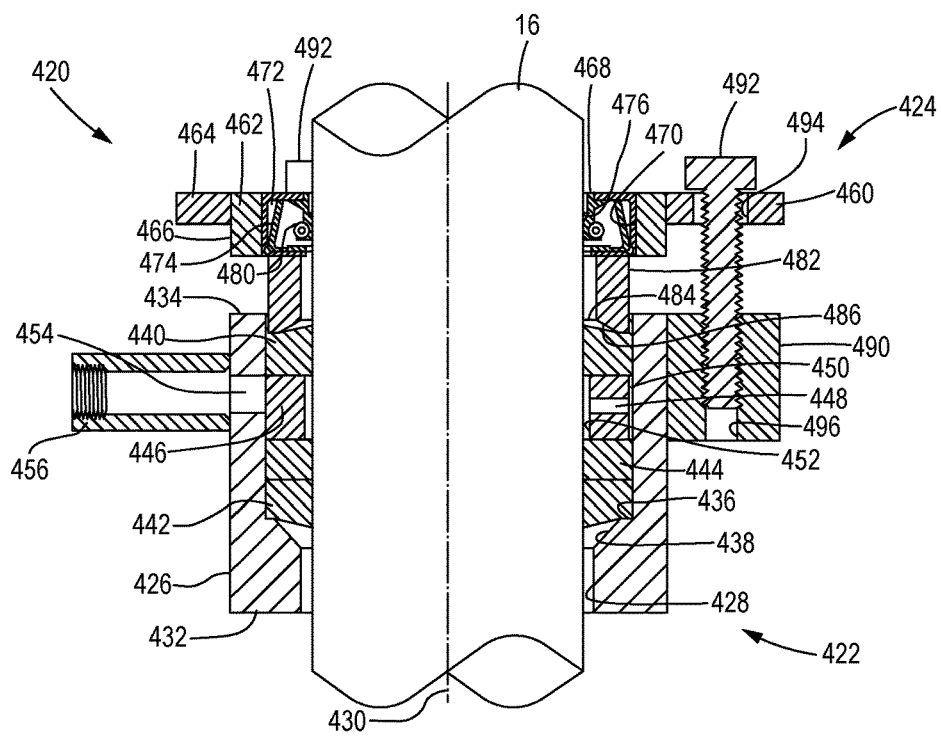
FIG. 25 is the cross-sectional view of the rotary seal of FIG. 23 with the fan shaft inserted through the rotary seal and with the seal cover attached to the seal housing and compressing seal rings disposed within the seal housing.

FIGS. 24 and 25 illustrate the installation of the fan shaft 16 and the closing and sealing of the rotary seal 420. Referring to FIG. 24, the first shaft end 114 of the fan shaft 16 is inserted through the seal cover 424, the seal housing 422 and the shaft opening of the stationary structure (not shown) such as the insulation dam assembly mounting plate 170. The first shaft end 114 may be chamfered for positive engagement and centering of the fan shaft 16 without damaging or rolling the lip seal 468 or the seal rings 440, 442, 444 during insertion. The seal housing 422 at the seal housing mounting end 432 is welded to the insulation dam assembly mounting plate 170 to for an air tight seal there between. A pilot bushing may be used to align the seal housing 422 with the mounting plate 170 to ensure axial alignment of the fan shaft 16. When the fan shaft 16 is inserted, the shaft engaging edge 478 of the lip seal 468 engages the shaft outer surface to form the lip seal ring seal, and the seal rings 440, 442, 444 may engage the shaft outer surface to initially form the seal ring inner seals in implementations where the seal ring inner diameter is less than the shaft outer diameter. In such arrangements, the seal housing 422, the seal cover 424 and the fan shaft 16 may be substantially axially aligned along the rotary seal longitudinal axis 430. As discussed above, the cavity ring outer diameter is less than the seal housing bore inner diameter and the cavity ring inner diameter is greater than the shaft outer diameter so air gaps are present between the seal housing inner surface 428 and the cavity ring outer surface 450, and between the cavity ring inner surface 452 and the shaft outer surface.

The rotary seal 420 is closed by screwing the anchor bolts 492 into the anchor bolt apertures 496 of the anchor blocks 490. As the anchor bolts 492 are tightened the seal cover 424 is forced toward the seal housing 422, the seal rings 440, 442, 444 are compressed between the seal ring engagement end 484 of the seal cover compression ring 482 and the seal housing bore shoulder 436. As the seal rings 440, 442, 444 are compressed in the axial direction, they increase in thickness in the radial direction. The seal rings 440, 442, 444 are pressed into the seal housing inner surface 428 and the shaft outer surface to strengthen the seal ring outer seals and the seal ring inner seals, respectively. The seal housing bore tapered portion 438 causes compression of the second seal ring 442 in the radial direction to further increase the seal ring seals proximate the seal housing mounting end 432. The engagement of the first seal ring 440 by the compression ring inner surface tapered portion 486 similarly strengthens the seal ring seals proximate the seal housing sealing end 434.

Even with the sealing ring seals created as described, the rotary seal 420 may not be completely airtight. Consequently, a risk may still exist for hazardous gases from the high temperature environment to pass through the rotary seal 420 and into the ambient environment. The rotary seal 420 can further prevent the leaking of hazardous gases by pressurizing the seal housing bore. Pressurization may be provided via the cavity ring 446 and the pressurized inlet passage 454. Pressurized air or fluid may be supplied by the pressurized air or fluid source (not shown) connected to the pressurized inlet passage 454 by the pressurized inlet connector 456. The seal rings 440, 442, 444 and the cavity ring 446 are dimensioned so that the cavity ring 446 moves axially but remains radially aligned with the pressurized inlet passage 454 after the seal rings 440, 442, 444 are compressed by the seal cover compression ring 482. The pressurized air or fluid fills the space between the cavity ring 446 and the seal housing bore, and flows through the cavity ring inlet passages 448 to fill the space between the cavity ring 446 and the shaft outer surface. In this way, the pressurized air or fluid suppresses flow of gases through both the seal ring inner seals and the seal ring outer seals. High temperature environment typically are not high pressure environments, some modest increases in the air pressure within the seal housing bore may be sufficient to prevent leakage of the hazardous gases. However, the air pressure in the seal housing bore may be increased as necessary to suppress air leakage from the high temperature environment in a particular implementation.

INDUSTRIAL APPLICABILITY

The various designs in accordance with the present disclosure can improve the manufacturability and the performance of industrial fan assemblies. For example, the modular design of the fan mount assembly 12 of FIGS. 1 and 3 may allow the industrial fan assembly 10 to be assembled more quickly and simply than previously known mount assemblies. As discussed, the top plate slots 74, 76 and the side plate tabs 86, 96 may be dimensioned to provide a relatively tight fit so that side plates 62, 64 may be approximately properly aligned with respect to the top plate 60 before being welded to each other and before adding additional support structures such as the tab gussets 100 and structural support brackets 102, 104. This arrangement may also reduce the total number of components that must be assembled to form the fan mount assembly 12. Further, the motor mount provided by the side plate tabs 86, 96 and the motor mounting bracket 130 allow for rapid and simple adjustment of the position of the motor 14 to achieve the necessary tension within the transmission 18. As the belts or other power transmission components wear and stretch over time during operation, or continuous line starting or the assembly 10 starting and re-starting, the motor mounting bracket 130 allows for fast re-tensioning or replacement of the components by loosening the motor height adjustment bolts 158. No other components or power transmission accessories need to be removed or loosened to gain proper access to defective or worn parts or to re-tension the power transmission accessories. Moreover, once assembled, the various lift openings 174-180 provide multiple options for attachment to the fan mount assembly 12 for transporting and installing the industrial fan assembly 10 in its operating environment.

The reinforcement bars 230 in the impellers 20, 260 provide increased structural support to withstand the normal loads and stresses to which the impellers 20, 260 will be subject, as well as additional thermal stresses that are experienced in high temperature environments and/or corrosive chemical environments. The reinforcement bars 230 can unitize the structure of the impellers 20, 260 so that the loads (torsional, thermal, etc.) experienced by the impeller blades 214, 220, 226, 264 during rotation may be transmitted through the impeller rings 216, 222, 228, 270 to the reinforcement bars 230 and ultimately to the impeller hub assembly 200. Reduction of the loads and stresses on the less robust components of the impellers 20, 260 can reduce deformation, fatigue, vibration and failure of the components and thereby increase the useful lives of the impellers 20, 260. Additionally, the configuration of the impeller hub assembly 200 with the impeller hub cone may promote fluid flow through the impellers 20, 260 by facilitating the redirection of the air from the axial flow from the fan housing inlet 46 to the radial flow through the impeller blades 214, 220, 226, 264 to the fan housing outlet 48. The impeller hub cone may further provide additional structural support by adding additional welded surface area when the impeller hub cone is welded to the hub outer surface 304 at the small diameter cone end 250 and to the impeller hub backplate 242 at the large diameter cone end 248.

The radial blade impeller 300 and the axial blade impeller 350 in accordance with the present disclosure are also provided with additional structural support of the impeller blades 322, 374, respectively, to extend the useful life of the impellers 300, 350. The hub sprockets 340 and their sprocket teeth 346 provide additional support to the impeller blade assemblies 310 proximate the points of connection between the blade arms 320 and the hub outer surface 304 where stress concentrations can lead to failure of the radial blade impeller 300. The cover plates 392, 394 and the cover plate arms 400, 408, respectively, perform similar structural support for the impeller blades 374 at areas of high stress concentrations. Additionally, the cover plate arms 400, 408 reinforce the entire lengths of the impeller blades 374 of the axial blade impeller 350 to maintain the curvature of the impeller blades 374 and the efficiency of the industrial fan assemblies 10, 30. In the designs of both impellers 300, 350, additional structural support is provided to the impeller blades 322, 374 without the sprocket teeth 346 and the cover plate arms 400, 408, respectively, significantly encroaching on the airflow paths between the impeller blades 322, 374 and through the impellers 300, 350 and creating undesired changes in the airflow.

The rotary seal 420 illustrated and described herein provides isolation of the ambient environment from high temperature and/or chemically induced corrosive environments despite the need to allow rotation of the fan shaft 16 extending there through. Use of seal rings 440, 442, 444 having low coefficients of friction, such as those formed from graphite rope, allow seals to be formed around the fan shaft 16 that can prevent heat transfer between the environments and leakage of gases and other particulate matter without significantly affecting the performance of the industrial fan assembly 10, 30. Graphite rope in particular may be resistant to many corrosive materials that may cause degradation in other materials that could be used to fabricate the seal rings 440, 442, 444. The effectiveness of the rotary seal 420 may be increased by pressurizing the seal housing bore to suppress leakage of gases through the seal ring seals using a neutral or non-contaminating gas or lubricant. The pressurization can prevent leakage of hazardous gases from the high temperature or corrosive environment to the ambient environment, and leakage of contaminants from the ambient environment into the high temperature environment where specific conditions are required for the high temperature operation.

While the preceding text sets forth a detailed description of numerous different embodiments, it should be understood that the legal scope of protection is defined by the words of the claims set forth at the end of this patent. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims defining the scope of protection.

It should also be understood that, unless a term was expressly defined herein, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to herein in a manner consistent with a single meaning, that is done for sake of clarity only so as to not confuse the reader, and it is not intended that such claim term be limited, by implication or otherwise, to that single meaning.

What is claimed is:

1. A fan mount assembly for an industrial fan assembly having a motor with a motor shaft, a fan shaft, a transmission operatively connecting the motor shaft to the fan shaft to drive the fan shaft, and an impeller mounted on the fan shaft, the fan mount assembly comprising:
   a top plate having a top plate top surface, a top plate bottom surface, a first top plate lateral edge, a second top plate lateral edge opposite the first top plate lateral edge, a first top plate slot proximate the first top plate lateral edge and a second top plate slot proximate the second top plate lateral edge;
   a first side plate having a first side plate inner surface, a first side plate outer surface, a first side plate top edge and a first side plate tab extending upward from the first side plate top edge; and
   a second side plate having a second side plate inner surface, a second side plate outer surface, a second side plate top edge and a second side plate tab extending upward from the second side plate top edge,
   wherein the first side plate tab is inserted through the first top plate slot until the first side plate top edge engages the top plate bottom surface, and the second side plate tab is inserted through the second top plate slot until the second side plate top edge engages the top plate bottom surface.

2. The fan mount assembly of claim 1, wherein the top plate comprises a third top plate slot proximate the first top plate lateral edge and a fourth top plate slot proximate the second top plate lateral edge, wherein the first side plate comprises a third side plate tab extending upward from the first side plate top edge and the third side plate tab is inserted through the third top plate slot when the first side plate tab is inserted through the first top plate slot, and wherein the second side plate comprises a fourth side plate tab extending upward from the second side plate top edge and the fourth side plate tab is inserted through the fourth top plate slot when the second side plate tab is inserted through the second top plate slot.

3. The fan mount assembly of claim 1, comprising an upper structural support bracket connect to the first side plate inner surface at the first side plate tab after the first side plate tab is inserted through the first top plate slot, and connected to the second side plate inner surface at the second side plate tab after the second side plate tab is inserted through the second top plate slot.

4. The fan mount assembly of claim 1, comprising a lower structural support bracket connect to the first side plate inner surface below the top plate bottom surface, and connected to the second side plate inner surface below the top plate bottom surface.

5. The fan mount assembly of claim 1, wherein the first side plate tab has a first motor height adjustment aperture and the second side plate tab has a second motor height adjustment aperture, the fan mount assembly comprising;
   a first motor height adjustment fastener;
   a second motor height adjustment fastener; and
   a motor mounting bracket comprising:
      a motor mounting plate having a motor plate top surface to which the motor is secured, a motor plate bottom surface, a first motor plate lateral edge and a second motor plate lateral edge opposite the first motor plate lateral edge,
      a first motor height adjustment plate extending downward from the first motor plate lateral edge and having a first motor height adjustment slot, and
      a second motor height adjustment plate extending downward from the second motor plate lateral edge and having a second motor height adjustment slot,
   wherein the first motor height adjustment aperture is aligned with the first motor height adjustment slot and the first motor height adjustment fastener is inserted there through, and the second motor height adjustment aperture is aligned with the second motor height adjustment slot and the second motor height adjustment fastener is inserted there through, and wherein a height of the motor mounting plate and the motor above the top plate is set by positioning the motor mounting bracket relative to the top plate and securing the first motor height adjustment plate to the first side plate tab with the first motor height adjustment fastener and the second motor height adjustment plate to the second side plate tab with the second motor height adjustment fastener.

6. The fan mount assembly of claim 5, wherein the top plate comprises a third top plate slot proximate the first top plate lateral edge and a fourth top plate slot proximate the second top plate lateral edge, wherein the first side plate comprises a third side plate tab extending upward from the first side plate top edge and having a third motor height adjustment aperture, and the third side plate tab is inserted through the third top plate slot when the first side plate tab is inserted through the first top plate slot, wherein the second side plate comprises a fourth side plate tab extending upward from the second side plate top edge and having a fourth motor height adjustment aperture, and the fourth side plate tab is inserted through the fourth top plate slot when the second side plate tab is inserted through the second top plate slot, wherein the first motor height adjustment plate has a third motor height adjustment slot and the second motor height adjustment plate has a fourth motor height adjustment slot, wherein the third motor height adjustment aperture is aligned with the third motor height adjustment slot and a third motor height adjustment fastener is inserted there through and secures the first motor height adjustment plate to the third side plate tab, and the fourth motor height adjustment aperture is aligned with the fourth motor height adjustment slot and a fourth motor height adjustment fastener is inserted there through and secures the second motor height adjustment plate to the fourth side plate tab.

7. The fan mount assembly of claim 1, wherein the industrial fan assembly includes an insulation dam assembly disposed about the fan shaft between the fan mount assembly and the impeller, the fan mount assembly comprising:

a first wing gusset extending from upward from the top plate top surface proximate the first top plate lateral edge and secured to the insulation dam assembly; and
a second wing gusset extending from upward from the top plate top surface proximate the second top plate lateral edge and secured to the insulation dam assembly.

8. The fan mount assembly of claim 7, wherein the top plate comprises a third top plate slot proximate the first top plate lateral edge and a fourth top plate slot proximate the second top plate lateral edge, wherein the first wing gusset extends upward from the first side plate top edge and is inserted through the third top plate slot when the first side plate tab is inserted through the first top plate slot, and wherein the second wing gusset extends upward from the second side plate top edge and is inserted through the fourth top plate slot when the second side plate tab is inserted through the second top plate slot.

9. A fan assembly, comprising:
a motor with a motor shaft;
a fan shaft;
a transmission operatively connecting the motor shaft to the fan shaft to drive the fan shaft;
an impeller mounted on the fan shaft;
a fan mount assembly top plate having a top plate top surface, a top plate bottom surface, a first top plate lateral edge, a second top plate lateral edge opposite the first top plate lateral edge, a first top plate slot proximate the first top plate lateral edge and a second top plate slot proximate the second top plate lateral edge;
a first shaft bearing mounted to the top plate bottom surface;
a second shaft bearing mounted to the top plate bottom surface, wherein the fan shaft extends through the first shaft bearing and the second shaft bearing;
a fan mount assembly first side plate having a first side plate inner surface, a first side plate outer surface, a first side plate top edge and a first side plate tab extending upward from the first side plate top edge; and
a fan mount assembly second side plate having a second side plate inner surface, a second side plate outer surface, a second side plate top edge and a second side plate tab extending upward from the second side plate top edge,
wherein the first side plate tab is inserted through the first top plate slot until the first side plate top edge engages the top plate bottom surface, and the second side plate tab is inserted through the second top plate slot until the second side plate top edge engages the top plate bottom surface.

10. The fan assembly of claim 9, wherein the fan mount assembly top plate comprises a third top plate slot proximate the first top plate lateral edge and a fourth top plate slot proximate the second top plate lateral edge, wherein the fan mount assembly first side plate comprises a third side plate tab extending upward from the first side plate top edge and the third side plate tab is inserted through the third top plate slot when the first side plate tab is inserted through the first top plate slot, and wherein the fan mount assembly second side plate comprises a fourth side plate tab extending upward from the second side plate top edge and the fourth side plate tab is inserted through the fourth top plate slot when the second side plate tab is inserted through the second top plate slot.

11. The fan assembly of claim 9, comprising an upper structural support bracket connect to the first side plate inner surface at the first side plate tab after the first side plate tab is inserted through the first top plate slot, and connected to the second side plate inner surface at the second side plate tab after the second side plate tab is inserted through the second top plate slot.

12. The fan assembly of claim 9, comprising a lower structural support bracket connect to the first side plate inner surface below the top plate bottom surface, and connected to the second side plate inner surface below the top plate bottom surface.

13. The fan assembly of claim 9, wherein the first side plate tab has a first motor height adjustment aperture and the second side plate tab has a second motor height adjustment aperture, the fan assembly comprising;
a first motor height adjustment fastener;
a second motor height adjustment fastener; and
a motor mounting bracket comprising:
a motor mounting plate having a motor plate top surface to which the motor is secured, a motor plate bottom surface, a first motor plate lateral edge and a second motor plate lateral edge opposite the first motor plate lateral edge,
a first motor height adjustment plate extending downward from the first motor plate lateral edge and having a first motor height adjustment slot, and
a second motor height adjustment plate extending downward from the second motor plate lateral edge and having a second motor height adjustment slot,
wherein the first motor height adjustment aperture is aligned with the first motor height adjustment slot and the first motor height adjustment fastener is inserted there through, and the second motor height adjustment aperture is aligned with the second motor height adjustment slot and the second motor height adjustment fastener is inserted there through, and wherein a height of the motor mounting plate and the motor above the fan mount assembly top plate is set by positioning the motor mounting bracket relative to the fan mount assembly top plate and securing the first motor height adjustment plate to the first side plate tab with the first motor height adjustment fastener and the second motor height adjustment plate to the second side plate tab with the second motor height adjustment fastener.

14. The fan assembly of claim 13, wherein the fan mount assembly top plate comprises a third top plate slot proximate the first top plate lateral edge and a fourth top plate slot proximate the second top plate lateral edge, wherein the fan mount assembly first side plate comprises a third side plate tab extending upward from the first side plate top edge and having a third motor height adjustment aperture, and the third side plate tab is inserted through the third top plate slot when the first side plate tab is inserted through the first top plate slot, wherein the fan mount assembly second side plate comprises a fourth side plate tab extending upward from the second side plate top edge and having a fourth motor height adjustment aperture, and the fourth side plate tab is inserted through the fourth top plate slot when the second side plate tab is inserted through the second top plate slot, wherein the first motor height adjustment plate has a third motor height adjustment slot and the second motor height adjustment plate has a fourth motor height adjustment slot, wherein the third motor height adjustment aperture is aligned with the third motor height adjustment slot and a third motor height adjustment fastener is inserted there through and secures the first motor height adjustment plate to the third side plate tab, and the fourth motor height adjustment aperture is aligned with the fourth motor height adjustment slot and a fourth motor height adjustment fastener is inserted there through and secures the second motor height adjustment plate to the fourth side plate tab.

15. The fan assembly of claim 9, comprising:
an insulation dam assembly disposed about the fan shaft between the fan mount assembly top plate and the impeller;
a first wing gusset extending from upward from the top plate top surface proximate the first top plate lateral edge and secured to the insulation dam assembly; and
a second wing gusset extending from upward from the top plate top surface proximate the second top plate lateral edge and secured to the insulation dam assembly.

16. The fan assembly of claim 15, wherein the fan mount assembly top plate comprises a third top plate slot proximate the first top plate lateral edge and a fourth top plate slot proximate the second top plate lateral edge, wherein the first wing gusset extends upward from the first side plate top edge and is inserted through the third top plate slot when the first side plate tab is inserted through the first top plate slot, and wherein the second wing gusset extends upward from the second side plate top edge and is inserted through the fourth top plate slot when the second side plate tab is inserted through the second top plate slot.

17. A fan mount assembly for an industrial fan assembly having a motor with a motor shaft, a fan shaft, a transmission operatively connecting the motor shaft to the fan shaft to drive the fan shaft, and an impeller mounted on the fan shaft, the fan mount assembly comprising:
a top plate having a top plate top surface, a top plate bottom surface, a first top plate lateral edge, a second top plate lateral edge opposite the first top plate lateral edge, a first top plate slot and a second top plate slot proximate the first top plate lateral edge, and a third top plate slot and a fourth top plate slot proximate the second top plate lateral edge;
a first side plate having a first side plate inner surface, a first side plate outer surface, a first side plate top edge, a first side plate tab extending upward from the first side plate top edge and having a first motor height adjustment aperture, and a second side plate tab extending upward from the first side plate top edge and having a second motor height adjustment aperture;
a second side plate having a second side plate inner surface, a second side plate outer surface, a second side plate top edge, a third side plate tab extending upward from the second side plate top edge and having a third motor height adjustment aperture, and a fourth side plate tab extending upward from the second side plate top edge and having a fourth motor height adjustment aperture, wherein the first side plate tab and the second side plate tab are inserted through the first top plate slot and the second top plate slot, respectively, until the first side plate top edge engages the top plate bottom surface, and the third side plate tab and the fourth side plate tab are inserted through the third top plate slot and the fourth top plate slot, respectively, until the second side plate top edge engages the top plate bottom surface;
a motor mounting bracket comprising:
a motor mounting plate having a motor plate top surface to which the motor is secured, a motor plate bottom surface, a first motor plate lateral edge and a second motor plate lateral edge opposite the first motor plate lateral edge,
a first motor height adjustment plate extending downward from the first motor plate lateral edge and having a first motor height adjustment slot and a second motor height adjustment slot, and
a second motor height adjustment plate extending downward from the second motor plate lateral edge and having a third motor height adjustment slot and a fourth motor height adjustment slot;
a first motor height adjustment fastener inserted through the first motor height adjustment aperture and the first motor height adjustment slot;
a second motor height adjustment fastener inserted through the second motor height adjustment aperture and the second motor height adjustment slot;
a third motor height adjustment fastener inserted through the third motor height adjustment aperture and the third motor height adjustment slot; and
a fourth motor height adjustment fastener inserted through the fourth motor height adjustment aperture and the fourth motor height adjustment slot,
wherein a height of the motor mounting plate and the motor above the top plate is set by positioning the motor mounting bracket relative to the top plate and securing the first motor height adjustment plate to the first side plate tab and the second side plate tab with the first motor height adjustment fastener and the second motor height adjustment fastener, and securing the second motor height adjustment plate to the third side plate tab and the fourth side plate tab with the third motor height adjustment fastener and the fourth motor height adjustment fastener.

18. The fan mount assembly of claim 17, comprising:
a first upper structural support bracket connect to the first side plate inner surface at the first side plate tab after the first side plate tab is inserted through the first top plate slot, and connected to the second side plate inner surface at the third side plate tab after the third side plate tab is inserted through the third top plate slot; and
a second upper structural support bracket connect to the first side plate inner surface at the second side plate tab after the second side plate tab is inserted through the second top plate slot, and connected to the second side plate inner surface at the fourth side plate tab after the fourth side plate tab is inserted through the fourth top plate slot.

19. The fan mount assembly of claim 17, comprising a lower structural support bracket connect to the first side plate inner surface below the top plate bottom surface, and connected to the second side plate inner surface below the top plate bottom surface.

20. The fan mount assembly of claim 17, wherein the industrial fan assembly includes an insulation dam assembly disposed about the fan shaft between the fan mount assembly and the impeller, the fan mount assembly comprising:
a first wing gusset extending from upward from the top plate top surface proximate the first top plate lateral edge and secured to the insulation dam assembly; and
a second wing gusset extending from upward from the top plate top surface proximate the second top plate lateral edge and secured to the insulation dam assembly.

* * * * *